United States Patent [19]

Kuroda et al.

[11] Patent Number: 5,457,335
[45] Date of Patent: Oct. 10, 1995

[54] FLOATING GATE FET WITH HYDROGEN BARRIER SHIELD

[75] Inventors: Kenichi Kuroda, Tachikawa; Toshifumi Takeda, Kodaira; Hisahiro Moriuchi, Tanashi; Masaki Shirai, Sayama; Jiroh Sakaguchi, Tama; Akinori Matsuo, Higashiyamato; Shoji Yoshida, Akishima, all of Japan

[73] Assignees: Hitachi, Ltd.; Hitachi VLSI Engineering Corp., both of Tokyo, Japan

[21] Appl. No.: 727,409

[22] Filed: Jul. 9, 1991

[30] Foreign Application Priority Data

Jul. 12, 1990 [JP] Japan ................... 2-184838
Nov. 8, 1990 [JP] Japan ................... 2-303118

[51] Int. Cl.⁶ ................................ H01L 27/115
[52] U.S. Cl. ................ 257/318; 257/630; 257/640; 257/645

[58] Field of Search .................. 257/318, 323; 257/630, 640, 645, 659

[56] References Cited

U.S. PATENT DOCUMENTS

| | | | |
|---|---|---|---|
| 4,019,197 | 4/1977 | Lohstroh et al. | 257/318 |
| 4,866,493 | 9/1989 | Arima et al. | 257/318 |
| 4,942,450 | 7/1990 | Iwashita et al. | 257/323 |
| 4,970,565 | 11/1990 | Wu et al. | 257/318 |

*Primary Examiner*—William D. Larkins
*Attorney, Agent, or Firm*—Antonelli, Terry, Stout & Kraus

[57] ABSTRACT

A nonvolatile storage element of a single-layer gate type structure is arranged so that a floating gate is formed of a conductive layer which partly overlaps with a control gate, formed of a diffused layer, and is provided with a barrier layer covering a part of or the whole surface of the floating gate. Nonvolatile storage elements characterized as such are used for redundancy control of defects or change of functions.

7 Claims, 29 Drawing Sheets

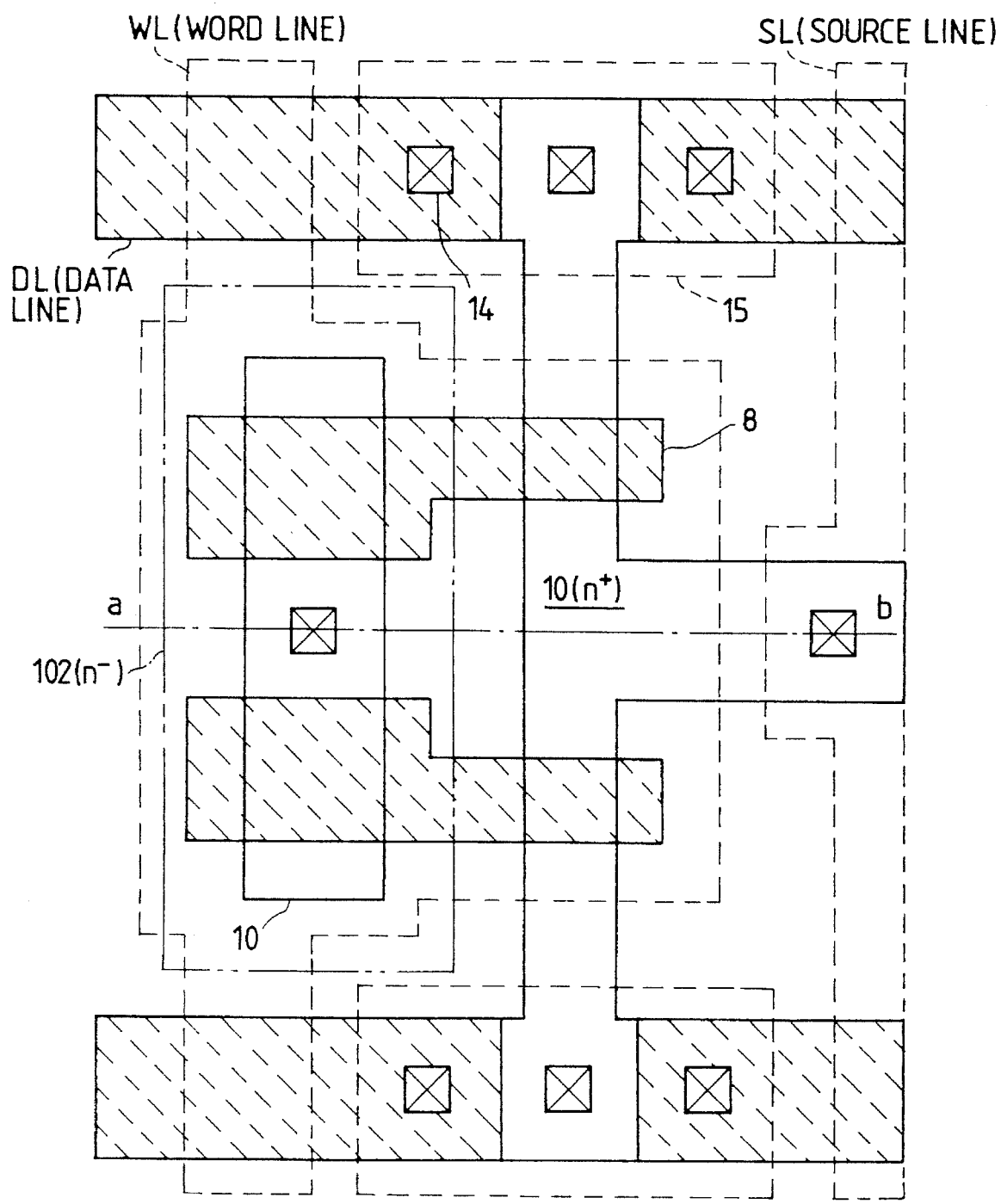

FLOATING GATE FET WITH HYDROGEN BARRIER SHIELD

BACKGROUND OF THE INVENTION

The present invention relates to a semiconductor integrated circuit device and, more particularly, to technology which is effectively applied in a semiconductor integrated circuit device including nonvolatile storage elements of a single layer polysilicon gate structure.

An example of a mask ROM (Read Only Memory), in which data are written using a mask, is disclosed in U.S. Pat. No. 4,939,386. Since this type of mask ROM can be fabricated by a poly-Si (polysilicon) one-layer process and is capable of storing one bit in one transistor, it is suitable for achieving larger capacity at lower cost. As mask ROMs are becoming more and more miniaturized, however, thereby increasing packaging density, some type of defect control technique must necessarily be adopted for improving yield. A known technique for controlling defective bits of the mask ROM is disclosed in, for example, ISSCC (International Solid-State Circuit Conference) Dig. Tech. Papers, Feb. 1989, pp. 128–129, 311. In this paper, a redundancy technique using polycrystalline Si fuse is disclosed.

SUMMARY OF THE INVENTION

During the course of developing a new and improved technique using EPROM for redundancy control of defects or altering data stored in semiconductor integrated circuit devices having a memory array of mask ROM or the like, the following problems became evident.

An art using an EPROM (Erasable Programmable Read-Only Memory) of a two-layer gate structure for selecting a redundancy circuit is disclosed in Japanese Laid-Open Patent Publication No. 60-83349. The two-layer gate structure mentioned above is such that it is formed by depositing a gate insulating film, a floating gate electrode formed of a first layer of poly-Si film, an insulating film, and a control gate electrode formed of a second layer of poly-Si film in succession on a semiconductor substrate. In the EPROM, it is required that a predetermined high voltage (around 12 V) be applied to the control gate of an EPROM cell for writing information therein. Accordingly, the insulating film must be a thin insulating film having a quality and thickness controlled so as to satisfy required writing/reading characteristics. Therefore, in technology using the EPROM of a two-layer gate structure for the redundancy circuit, it is required that a special fabrication step be added for forming, for example, a highly reliable insulating film to be interposed between the floating gate and the control gate which thereby increases the number of fabrication steps. Known EPROMs of a two-layer gate structure are disclosed, for example, in U.S. Pat. No. 4,918,501 and IEDM (International Electron Device Meeting) Tech. Dig., pp. 631–634, 1985.

Further, a technology using an EPROM of a single-layer polysilicon gate structure is described, for example, in The Transactions of the Institute of Electronics, Information, and Communication Engineers, Vol. 90, No. 47, pp. 51–53, May 21, 1990.

The present inventors have carefully considered data retaining characteristics in connection with the development of their improved EPROM cell (nonvolatile storage element) and, through careful analyses of the relationship between the structure of the element and the data retaining characteristic, they were able to scheme their invention which is directed to a nonvolatile storage element of single-layer gate structure whereby the data retaining characteristic is improved and to a semiconductor integrated circuit device using such storage elements.

An object of the present invention is to provide a semiconductor integrated circuit device comprising nonvolatile storage elements of single-layer gate structure whereby the data retaining characteristics are improved.

Another object of the present invention is to provide a semiconductor integrated circuit device which is easy to fabricate and in which redundancy control of defects, change of functions, and trimming can be reliably achieved.

The above and other objects and novel features of the present invention will be better understood from the following description taken in connection with the accompanying drawings.

A representative aspect of the invention disclosed herein will be briefly described as follows.

A barrier layer is provided for a nonvolatile storage element of single-layer gate structure, which is constructed by arranging a floating gate formed of a conductive layer to partly overlap with a Control gate formed of a diffusion layer, such that the barrier layer covers a part or the whole (or entire) surface of the floating gate. Such nonvolatile storage elements are used for redundancy control of defects or change of functions.

By the above described means, radical hydrogen presumed, to diffuse from a final passivation film on the surface of the element is captured by the barrier layer, and, accordingly, a collapsing of information charges stored on the floating gate can be prevented. Thereby, with high reliability, redundancy control of defects or change of functions of semiconductor integrated circuit devices can be attained.

BRIEF DESCRIPTION OF THE DRAWINGS

FIG. 21E is a plan view according to the embodiment illustrated in FIGS. 21A–21D;

DESCRIPTION OF THE PREFERRED EMBODIMENTS

To begin with, the relationship between the structure of the element and data retaining characteristic thereof, discovered by the present inventors, will now be described.

While conducting analyses of data retaining characteristics of EPROMs, we found the following phenomena.

Figure 16:
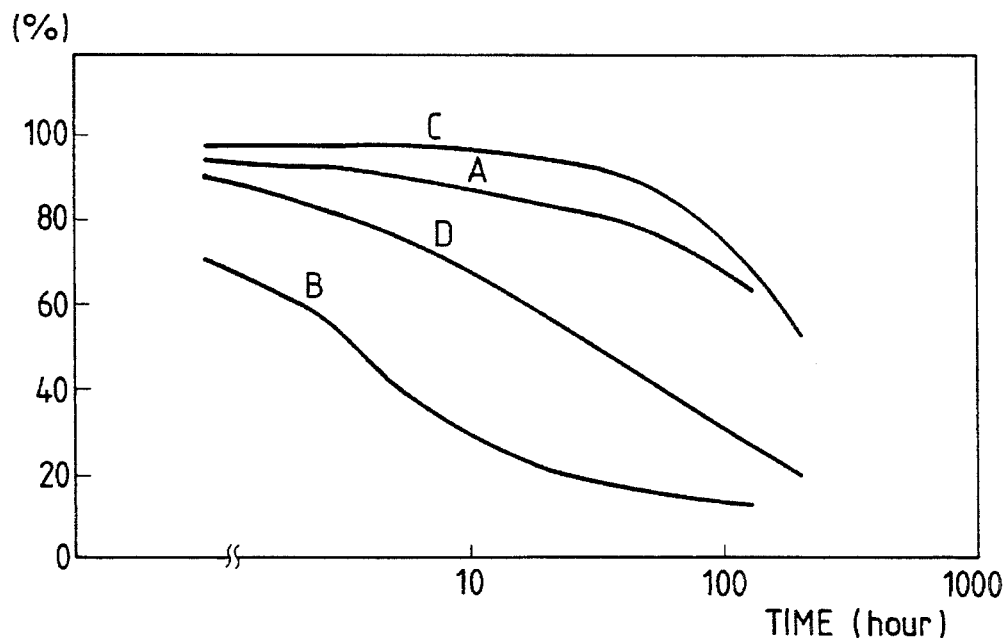
FIG. 16 is a data retaining characteristic diagram of a nonvolatile storage element for explaining the present invention.

FIG. 16 shows data retaining characteristics of EPROMs of different structures. In FIG. 16, the axis of abscissa represents time and the axis of ordinate represents coefficients of variation of the threshold voltage [$\Delta V_{tht} \div \Delta V_{th0} \times 100$]%, where $\Delta V_{th0}$ represents the threshold voltage at the time of writing and $\Delta V_{tht}$ represents the threshold voltage when time t elapsed. The data retaining characteristics were measured under the condition that the devices are let alone in the air at a temperature of 300° C.

Referring to FIG. 16, the element structure of the characteristic B is an EPROM of a single-layer polysilicon gate structure and that of the characteristic D is an EPROM of a two-layer gate structure. From the difference in the data retaining characteristics between these EPROMS, we hypothesized that the control gate in the two-layer gate structure acts as a barrier layer and prevents the information charges stored on the floating gate from decreasing. To confirm the truth of the supposition, we prepared an EPROM of single-layer polysilicon gate structure by providing an aluminum layer placed over the whole surface of the above mentioned floating gate formed of single-layer polysilicon layer. By measuring the data retaining characteristic of such EPROM, a great improvement in the data retaining characteristic is observed as shown in the characteristic A. It was also found that a good data retaining characteristic as shown in the characteristic C is obtained when an oxide film (P-SiO) formed by a plasma CVD (Chemical Vapor Deposition) method is provided over the element of a two-layer gate structure. The above mentioned oxide film (P-SiO) is what is formed as interlayer insulating film between two metal (aluminum) wiring layers. That is, the EPROM is of a two-layer gate structure with the aluminum layer as the first layer formed on a BPSG (Boron-doped Phospho-Silicate Glass) film and an aluminum layer as the second layer formed over the same through the above mentioned oxide film (P-SiO).

Through careful analyses of the relationship between the above described element structure and the data retaining characteristics thereof, the present inventors have been able to achieve their invention, which is related to a nonvolatile storage element of single-layer gate structure having an improved data retaining characteristic and to a semiconductor integrated circuit device employing such elements.

FIG. 1A to FIG. 1D show fabrication step sectional views for explaining a nonvolatile storage element according to the present invention together with the simultaneously formed N-channel MISFET (Metal-Insulator-Semiconductor Field Effect Transistor) and P-channel MISFET. MISFET herein is used as representing insulated-gate field-effect transistor (IGFET).

Referring to FIG. 1A to FIG. 1D, there are shown a nonvolatile storage element QE of single-layer polysilicon gate structure, an N-channel MISFET QN, and a P-channel MISFET from left to right. The N-channel MISFET QN and the P-Channel MISFET QP are used for constructing peripheral circuits such as an address selector circuit of the nonvolatile storage element, another memory circuit, or a digital circuit formed on the same semiconductor substrate on which the EPROM according to the present invention is formed. Of the nonvolatile storage element QE, the sectional view perpendicular to the source and drain is shown to the left and that parallel to them is shown to the right.

Figure 1A:
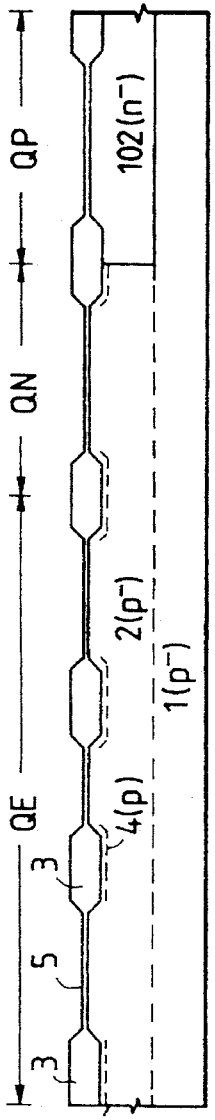
FIG. 1A to FIG. 1D are fabrication step sectional views of an embodiment for describing a nonvolatile storage element according to the present invention.

Referring to FIG. 1A, a P-type well 2 and an N-type well 102 are formed on one principal plane of a P-type semiconductor substrate 1 by a known method. Then, a thick field insulating film 3 with a P-channel stopper 4 shown by a broken line thereunder is formed.

Figure 1B:
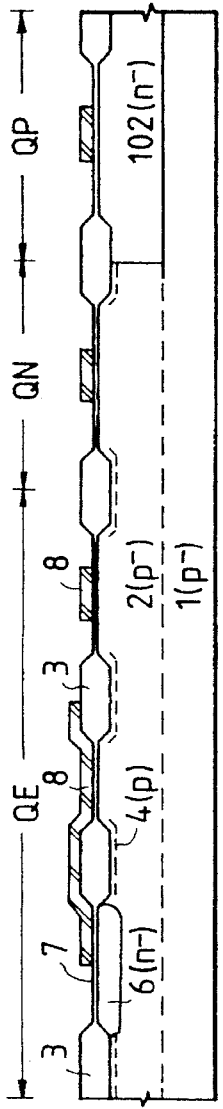

Referring to FIG. 1B, an N-type diffusion layer 6 becoming the control gate of the nonvolatile storage element QE is formed. The N-type diffusion layer 6 is usually, but not exclusively, formed by injecting approximately $1\times10^{14}$ cm$^{-2}$ of phosphor in place by an ion injection method at 80 Key of acceleration energy through an insulating film 5 and then performing a heat treatment of the device for approximately 30 minutes at temperature of 950° C. in an atmosphere of nitrogen including 1% or so of oxygen. Of course, as the impurity, arsenic only or both arsenic and phosphor can be used. Basically, the heat treatment need not be performed, but it is better to perform the heat treatment to cure the semiconductor substrate 1 of the damage caused by the ion injection.

After the insulating film 5 damaged by the ion injection has been removed, a clean gate insulating film 7 is formed by, for example, thermal oxidation. At this time, the film of the gate insulating film 7 over the N-type diffusion layer 6 is formed 10 to 20% thicker than that over the region where there is formed no N-type diffusion layer 6.

Then, a conductive layer 8 becoming the floating gate of the nonvolatile storage element QE and the gate electrodes of the N-channel MISFET QN and P-channel MISFET QP are formed. The conductive layer 8 is formed of a polycrystalline silicon (polysilicon) film or a polycide film which is obtained by laminating a silicide film to a polycrystalline silicon film.

Figure 1C:
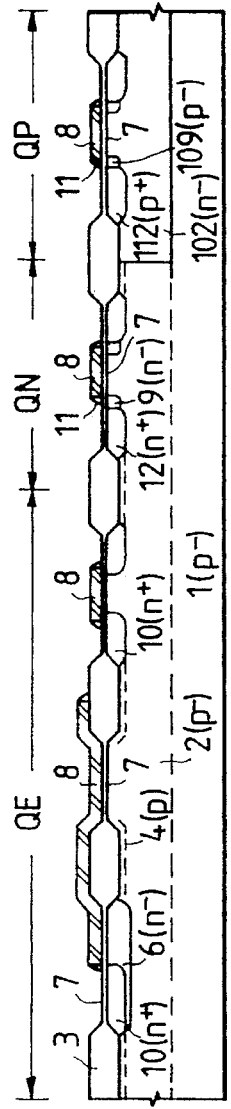

N-type diffusion layers 9 and 10 and P-type diffusion layer 109 are formed as shown in FIG. 1C. The N-type diffusion layer 9 is formed, for example, by injecting approximately $2\times10^{13}$ cm$^{-2}$ of phosphor in place by the ion injection method at 50 Key of acceleration energy, while the N-type diffusion layer 10 is formed, for example, by injecting approximately $5\times10^{15}$ cm$^{-2}$ of phosphor in place by the ion injection method at 50 Key of acceleration energy. The P-type diffussion layer 109 is formed, for example, by injecting approximately $1\times10^{13}$ cm$^{-2}$ of boron in place by the ion injection method at 15 Kev of acceleration energy.

Then, after a CVD insulating film has been formed over the whole surface, side walls 11 are formed by anisotropic etching. Then, N-type diffusion layer 12 and P-type diffusion layer 112. are formed. The N-type diffusion layer 12 is formed by injecting approximately $5\times10^{15}$ cm$^{-2}$ of arsenic in place by the ion injection method at 80 Kev of acceleration energy. The P-type diffusion layer 112 is formed by injecting approximately $2\times10^{15}$ cm$^{-2}$ of boron in place by the ion injection method at 15 Kev of acceleration energy.

In the present invention, the N-type diffusion layer 10 was described to be formed before the formation of the side walls 11, but it may be formed after the formation of the side walls 11.

The fabrication step of the P-type diffusion layer 109 may be omitted and the P-type diffusion layer 112 may be formed before the formation of the side walls 11. In this case, the N-type diffusion layer 9 can be formed without using a mask but injecting ions into the whole surface.

Figure 1D:
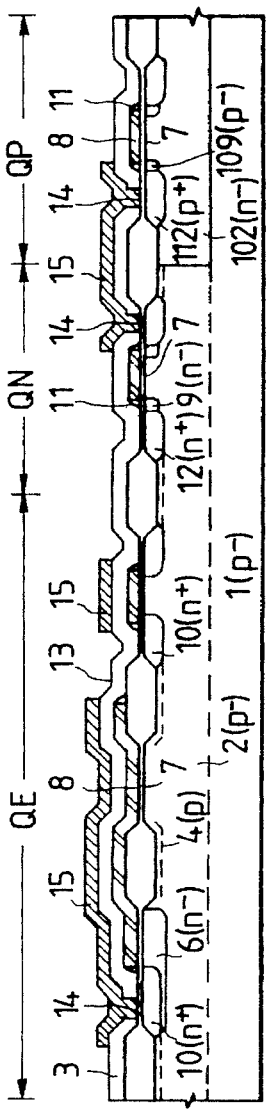

Referring to FIG. 1D, the nonvolatile storage element QE is arranged in a single-layer gate structure made up of the control gate formed of the diffusion layers 6 and 10, floating gate 8, gate insulating film 7, interlayer insulating film 7 between the control gate and floating gate, and the source and drain formed of the N-type diffusion layer 10. The reason why the source and drain are formed by the N-type diffusion layer is because the writing characteristic is thereby enhanced. The N-type diffusion layer 10 is of the same structure as that of the source and drain of the N-channel MISFET QN constituting the input and output. The N-channel MISFET QN is arranged in the so-called LDD (Lightly Doped Drain) structure made up of the gate electrode 8, gate insulating film 7, and the source and drain formed of the N-type diffusion layers 9 and 12. The P-channel MISFET QP is arranged in the so-called LDD structure made up of the gate electrode 8, gate insulating film 7, and the source and drain formed of the P-type diffusion layers 109 and 112. Each element is separated by the field insulating film 3 and the P-type channel stopper 4. Connection between the elements is achieved by a wiring 15 formed of aluminum through a contact hole made in the insulating film 13. The N-type diffusion layers 6 and 10 as the control gate of the nonvolatile storage element QE are shunted by the wiring 15 so that the parasitic resistance is reduced. That is, the wiring 15 constitutes the word line and it is connected with the control gate of each nonvolatile storage element. The N-type diffusion layer 10 is provided for improving the ohmic contact of the control gate with the wiring 15.

In the present embodiment, to improve the data retaining characteristic of the nonvolatile storage element QE of the described single-layer gate structure, the aluminum layer 15 covering the whole surface of the floating gate 8 with the insulating film 13 interposed therebetween is formed as a barrier layer. The insulating film 13 is formed, for example, of a PSG (Phospho-Silicate Glass) film or BPSG film. The aluminum layer 15 as the barrier layer formed to cover the whole surface, not exclusively, of the floating gate through the insulating film 13 is formed integrally with the word line to which the control gate of the nonvolatile storage element QE is connected.

When the nonvolatile storage element QE of the present embodiment is used for redundancy control of defects in the mask ROM as will be described later, the N-channel MISFET QN is made to have a similar arrangement to the storage element. However, referring to FIG. 1A, there is introduced N-type impurity by an ion injection method into the portion where the mask ROM is formed so that the N-channel MISFET formed there is arranged in the depletion mode.

Figure 4:
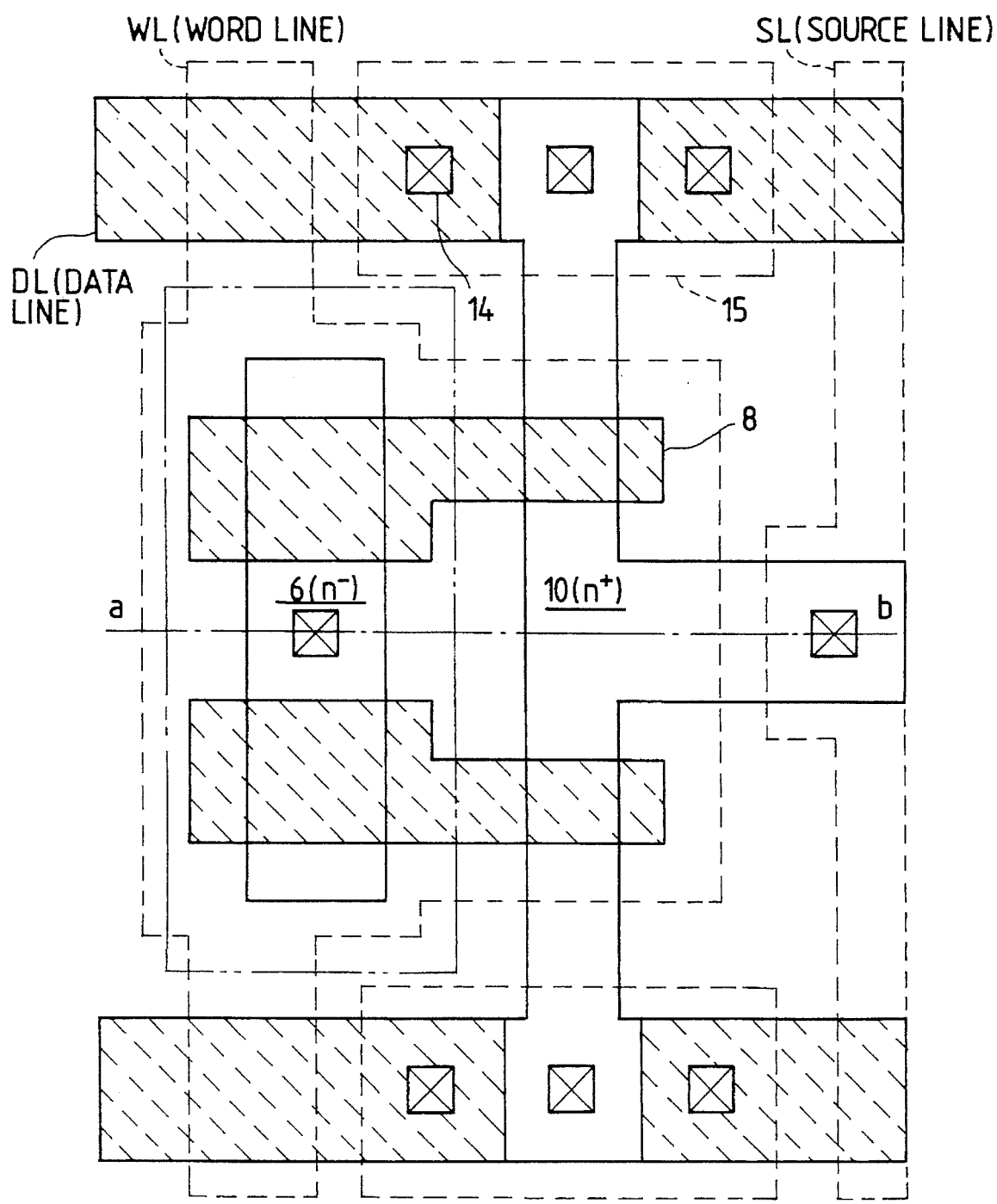
FIG. 4 is a an element pattern diagram showing an embodiment of nonvolatile storage element according to the present invention.

FIG. 4 shows an element pattern diagram of an embodiment of a nonvolatile storage element QE.

The N-type diffusion layer 6 as the control gate is connected with the word line WL formed of the aluminum layer 15 indicated by dotted lines in the diagram through the contact hole 14. The aluminum layer 15 is formed to extend toward the right-hand side along the floating gate 8, hatched by dashed lines in the diagram, so as to cover the whole surface of the floating gate 8 to thereby function also as the barrier layer for the floating gate 8. In the diagram, there are shown two memory cells vertically symmetrical about a chain line a-b. More specifically, the drain of the upper nonvolatile storage element QE is connected to the aluminum layer 15 through the contact hole 14. This aluminum layer 15 is connected, through the contact hole 14, with the data line DL formed of a polysilicon layer and extending to left and right. The N-type diffusion layer 10 constituting the source of the upper nonvolatile storage element QE is formed integrally with the source of the lower nonvolatile storage element QE and is extended along the center line a-b to the right as far as the region where it does not intersect with the aluminum layer 15 constituting the barrier layer and the aluminum layer connecting the drain with the word line formed of a polysilicon layer, and there it is connected with the source line SL formed of an aluminum layer extended vertically, i.e., parallel with the word line, through a contact hole 14 made there.

The nonvolatile storage element QE of single-layer gate structure of the present embodiment is provided with a barrier layer formed of the aluminum layer so as to cover the whole surface of the floating gate. In this embodiment, the barrier layer is arranged to have a large enough size to exceed the size of the floating gate 8 in order to prevent diffusing radical hydrogen from being injected into the floating gate, as will be described later.

From the data retaining characteristics as shown in FIG. 16, the following things can be considered. The characteristic D shows an improvement in the data retaining characteristic over the characteristic B. The difference in structure between them is that the characteristic B has a single-layer gate structure while the characteristic D has a two-layer gate structure. From this, we surmised that the control gate in the two-layer gate structure has the function to prevent such factors that diminish the retained electric charges on the floating gate from getting into the floating gate. In order to confirm this, an element in which an aluminum layer, as shown in FIG. 1D or FIG. 4, is formed as a barrier layer over the floating gate in a single-layer gate structure was fabricated. The data retaining characteristic obtained from such element showed a remarkable improvement in the retaining characteristic as shown in the characteristic A.

A presumption that one of the factors to diminish the information charges stored on the floating gate would be that resulting from the formation of radical hydrogen from the final passivation film was made for the following reason. That is, although it is not shown in FIG. 16, it was found that the data retaining characteristic became worse when plasma nitride (P-SiN) film was used as the final passivation film than when CVD oxide (PSG) film was used. These films greatly differ in the quantity of radical hydrogen. Therefore, this conclusion was reached that the aluminum layer, as the barrier layer, itself includes a large quantity of hydrogen and hence dam ups the radical hydrogen and prevents the hydrogen from diffusing into the floating gate.

As the barrier layer, a polysilicon layer may also be used. The polysilicon layer has a property to easily accept hydrogen, and hence, when it is used as the floating gate, it captures the hydrogen diffused thereto from the final passivation film and loses the information charges thereon. Making a reverse use of this property, a polysilicon layer is formed as the barrier layer over the floating gate. The polysilicon layer as the barrier layer captures the radical hydrogen diffusing from the final passivation film before the floating gate provided thereunder does, thus preventing the hydrogen from diffusing into the floating gate. As a result, the same as with the above described aluminum layer, the polysilicon layer as the barrier layer functions as, so to say, a dam against the radical hydrogen and prevents it from getting into the floating gate.

The above phenomena are just what are imagined, but as apparent from the data retaining characteristics shown in FIG. 16, the provision of the barrier layer as described above apparently improves the data retaining characteristic of the nonvolatile storage element of single-layer gate structure.

Figures 33A, 33B:
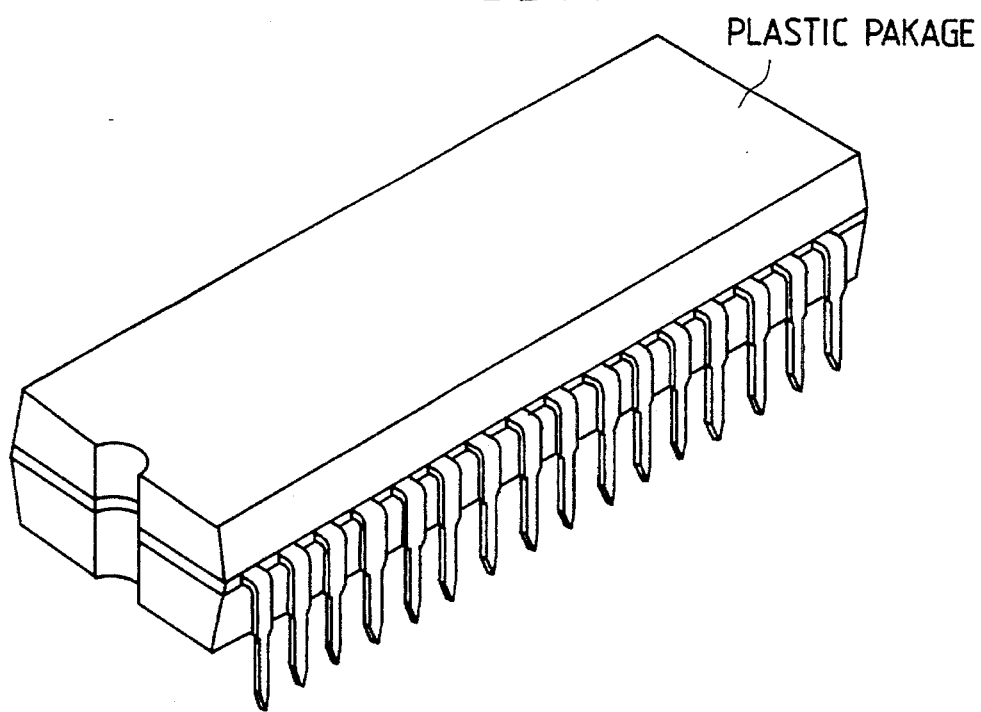
FIG. 33A is a perspective view of a semiconductor integrated circuit device after being encapsulated in a package.
FIG. 33B is a top view of the device illustrated in FIG. 33A showing a pin arrangement.

When a plasma nitride (P-SiN) is used for the final passivation film, a low-priced plastic package can be utilized as shown in FIG. 33A. Therefore, by providing such a barrier layer as in the present embodiment, a semiconductor integrated circuit device, using the low-priced package, in which the data retaining characteristic is improved can be obtained.

Figure 2:
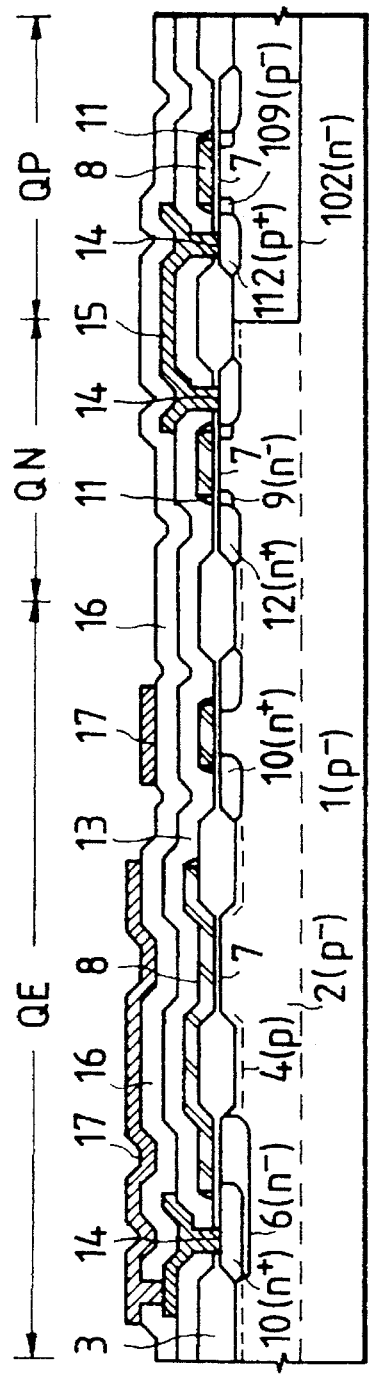
FIG. 2 is a sectional view of an element structure showing another embodiment of nonvolatile storage element according to the present invention.

FIG. 2 shows an element structure sectional view of another embodiment of nonvolatile storage element according to the present invention.

The present embodiment is directed to the case where two layers of aluminum wiring s are used in the semiconductor integrated circuit device provided with the nonvolatile storage element. That is, the aluminum layer 15 constituting the first layer is not used as the barrier layer as shown in FIG. 1D, but the aluminum layer 17, constituting the second layer formed over the interlayer insulating film 16 formed over the aluminum layer 15 is adapted to cover the whole surface of the floating gate formed of the polysilicon layer 8. In this arrangement, the aluminum layer 17 of the second layer when used as the word line is connected with the control gate formed of the diffusion layers 6 and 10 of the nonvolatile storage element QE by means of the contact holes 14 made in the interlayer insulating films 13 and 16 and the aluminum layer 15 of the first layer.

When the aluminum layer 15 of the first layer is used as the word line, which is not shown, the aluminum layer 17 of the second layer formed as the barrier layer is held in an electrically floating state simply covering over the floating gate 8.

In arranging the aluminum layers in two layers as described above, the arrangement in which the aluminum layer of the second layer is used as the word line and the aluminum layer of the first layer is used as the data line and the arrangement, in which, contrary to the above, the aluminum layer of the first layer is used as the word line and the aluminum layer of the second layer is used as the data line are both practicable. Such an arrangement in which the two aluminum layers are used as a common source line or as a later described sub-word line is also practicable.

Referring to FIG. 2, there are also shown an N-channel MISFET and a P-channel MISFET. Since the N-channel MISFET and P-channel MISFET are the same as those shown in FIG. 1D, description thereof will be omitted.

Figure 3:
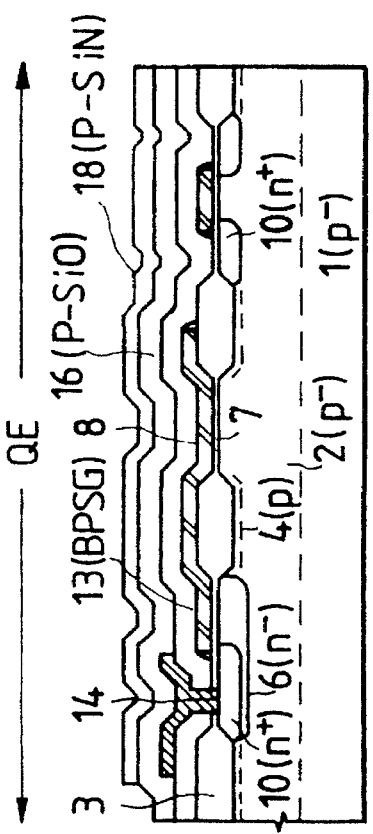
FIG. 3 is a sectional view of an element structure showing yet another embodiment of nonvolatile storage element according to the present invention.

FIG. 3 shows an element structure sectional view of yet another embodiment of nonvolatile storage element according to the present invention.

Referring to the characteristic diagram of FIG. 16, the characteristic C is that of the nonvolatile storage element having a two-layer gate structure and having an oxide film (P-SiO) formed by a plasma-CVD method provided as the interlayer insulating film between the aluminum layer of the first layer and the aluminum layer of the second layer. Since it has extremely better data retaining characteristic than the characteristic D of the nonvolatile storage element similarly having a two-layer gate structure but having no such oxide film (P-SiO), we noticed that the oxide film (P-SiO) itself also has the function to prevent diffusion of the radical hydrogen. Namely, the oxide film (P-SiO) is deposited on the aluminum layer by introducing mono-silane ($SiH_4$) plus nitrogen oxide ($N_2O$) as the material gas into a plasma reaction chamber, and therefore, it is supposed that the film itself has small quantity of hydrogen and has the function to absorb the diffused radical hydrogen.

On account of this, in the embodiment shown, the first interlayer insulating film 13 was formed of a PSG film or a BPSG film and the second interlayer insulating film 16 was formed of the above described oxide film (P-SiO), and, as the final passivation film 18, the above described plasma nitride film (P-SiN) was used.

The above described arrangement of the interlayer insulating films is the same as that in the two-layer aluminum wirings shown in FIG. 3. Therefore, the first aluminum layer 15 over the interlayer insulating film (PSG or BPSG) 13 may constitute the word line or the like, and the second aluminum layer on the interlayer insulating film (P-SiO) 16 may constitute the data line, common source line, or other wiring, not shown.

In the embodiment of FIG. 2, if the oxide film (P-SiO) formed by the above described plasma-CVD method is used for the interlayer insulating film 16, the double barrier layer can be provided by the oxide film (P-SiO) and the aluminum layer and it is presumed that the element of such arrangement will provide a data retaining characteristic as good as the characteristic C of FIG. 16.

Below will be given description of a redundancy circuit for controlling defects in a mask ROM using the above described nonvolatile storage element of single-layer gate structure.

Figure 6:
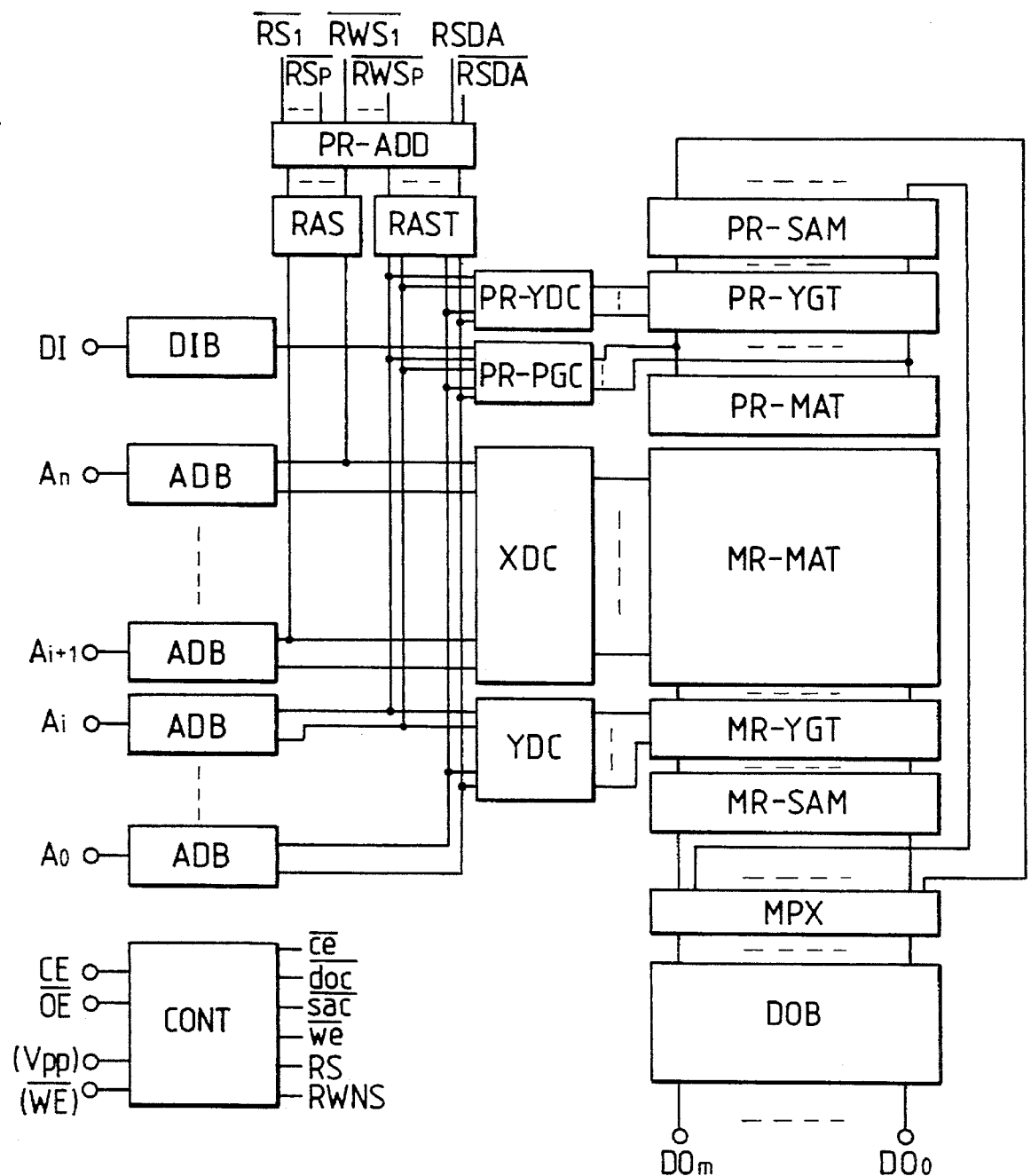
FIG. 6 is a block diagram showing an embodiment of mask ROM to which the present invention is applied.

FIG. 6 shows a block diagram of an embodiment of mask ROM to which the present invention is applied.

A memory mat MR-MAT is constituted of memory elements for mask ROM arranged in a matrix array. A memory mat PR-MAT is constituted of the above described nonvolatile storage elements of a single-layer gate structure arranged in a matrix array and used for the redundancy control of defective data.

The memory mat MR-MAT, the same as the known mask ROM, has memory elements disposed at intersections of the word lines and the data lines. The gate of the memory element is connected with the word line, the drain is connected with the data line, and the source is connected with the ground line of the circuit.

The word line of the memory mat MR-MAT is selected by the X-decoder circuit MR-XDC. The X-decoder circuit MR-XDC decodes a complementary internal address signal generated by address buffers ADB accepting X-system address signals $A_{i+1}$—$A_n$ and selects one word line of the memory mat MR-MAT.

The data line of the memory mat MR-MAT is connected to the common data line by a column switch gate MR-YGT. The column switch gate MR-YGT, in accordance with a decoded signal generated by a Y-decoder circuit YDC which decodes a complementary internal address signal generated by address buffers ADB accepting Y-system address signals $A_0$–$A_i$, connects one data line of the memory mat MR-MAT for each of output mats to the common data line.

The common data line is connected to the input terminal of a sense amplifier circuit MR-SAM. The sense amplifier circuit MR-SAM amplifies the storage information read out from the memory element at the intersection of the selected word line and data line.

The memory mat PR-MAT is constructed of the above described nonvolatile storage elements of single-gate structure disposed at the intersections of the word lines and data lines and used as a redundancy circuit for defective data in the memory mat MR-MAT. The control gate of the nonvolatile storage element is connected with the word line, the drain is connected with the data line, and the source is connected with the ground line. The word line of the redundancy memory mat PR-MAT is supplied with a redundancy word line selection signal generated by a later described redundancy address storage circuit PR-ADD.

The data line of the redundancy memory mat PR-MAT is connected with a write data input circuit PR-PGT and a column switch gate PR-YGT. The write data input circuit PR-PGT, in accordance with a complementary internal address signal generated by address buffers ADB accepting the Y-system address signals $A_0$–$A_i$ and a data signal generated by an input buffer DIB accepting a write data input DI, transmits a write signal to one data line of the redundancy memory mat PR-MAT. The column switch gate MR-YGT connects one data line for each output mat of the redundancy memory mat PR-MAT to the common data line in accordance with an output signal of the Y-decoder PR-YDC decoding a complementary internal address signal generated by address buffers ADB accepting the Y-system address signals $A_0$–$A_i$. The common data line is connected with the input terminal of the sense amplifier circuit MR-SAM. The sense amplifier circuit MR-SAM amplifies the storage information read out from the memory cell (nonvolatile storage element) at the intersection of the word line and data line selected in the read mode.

The output signal of the sense amplifier circuit PR-SAM is input to a multiplexer circuit MPX for switching the sense amplifier circuits. The multiplexer circuit MPX selects either of the output signal of the sense amplifier circuit MR-SAM for the mask ROM and the output signal of the sense amplifier circuit PR-SAM for the redundancy memory mat PR-MAT and transmits the selected signal to an output buffer DOB. The output buffer DOB delivers the read data transmitted thereto through the multiplexer circuit MPX, from output terminals $DO_0$–$DO_m$.

In the present embodiment, the above described nonvolatile storage element is, not exclusively, used for storing the redundancy address. The method for storing the redundancy address is such that the address signal generated by the address buffer circuits ADB accepting the X-system address signals $A_{i+1}$–$A_n$ is converted by an redundancy address selector circuit RAS into write data to be stored in the nonvolatile storage element disposed in the redundancy address storage circuit PR-ADD. The redundancy address storage circuit PR-ADD is, not exclusively,.adapted to be capable of storing a plurality of redundancy word lines. These plurality of redundancy word lines are assigned for conversion of the redundancy address storage positions by a redundancy word line selector circuit RAST decoding a complementary address signal generated by address buffer circuits ADB accepting the Y-system address signals $A_0$–$A_i$.

The redundancy address storage circuit PR-ADD stores the redundancy addresses and, in addition, generates word line selection signals $\overline{RWS}_1$–$\overline{RWS}_p$ of the written address to thereby perform selection of the word line of the redundancy memory mat PR-MAT. It, further, generates complementary signals RSDA, $\overline{RSDA}$ for switching the outputs of the multiplexer circuit MPX.

A control circuit CONT accepts a chip enable signal CE for activating the present semiconductor integrated circuit device and an output enable signal $\overline{OE}$ for controlling the output buffer at the time of reading to thereby generate activation signals $\overline{ce}$ for each of the blocks, an activation signal $\overline{sac}$ for the sense amplifier circuit MR-SAM, and an activation signal $\overline{doc}$ for the output buffer circuit DOB and, further, accepts the high voltage terminal Vpp for writing into the nonvolatile storage elements (PR-MAT, PR-ADD) provided for redundancy control and not exclusively, a write enable signal $\overline{WE}$ for performing write control to thereby generate an internal write control signal $\overline{we}$, a redundancy address storing write signals RS, a signal RWNS, etc.

Figure 7:
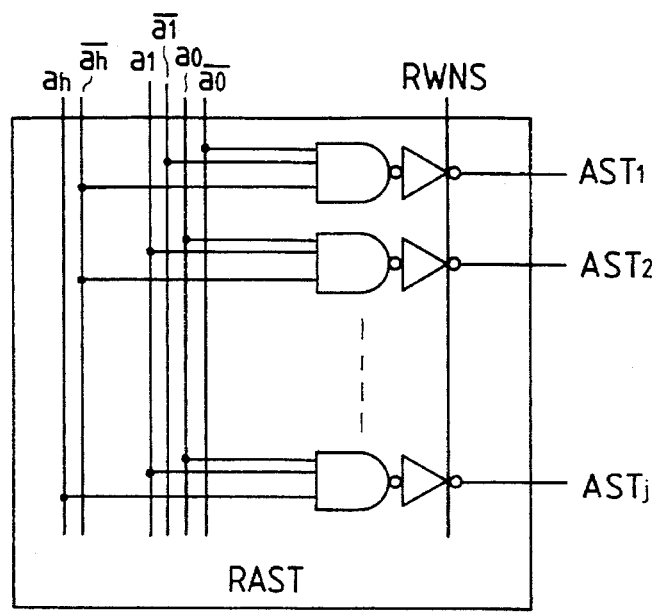
FIG. 7 is a circuit diagram showing an embodiment of redundancy word line selector circuit RAST in the above mask ROM.

FIG. 7 shows a circuit diagram of an embodiment of the redundancy word line selector circuit RAST.

This circuit accepts complementary address signals a0, $\overline{a0}$–ah, $\overline{ah}$ generated by the address buffer circuits ADB receiving the Y-system address signals $A_0$–$A_h$ ($h \leq i$) and, in response to the signal RWNS activated at the time of writing into the storage element of the redundancy address storage circuit PR-ADD, generates a storage position assignment signal $AST_1$–$AST_j$. For example, when three-bit address signals $A_0$–$A_2$ are used, eight kinds of storage position assignment signals $AST_1$–$AST_8$ can be generated. Thereby, up to eight word lines of the memory mat MR-MAT involving defective bits can be replaced by the storage cells of the redundancy memory mat PR-MAT. Therefore, when the redundancy address storage circuit PR-ADD as described above is used, nonvolatile storage elements corresponding to the above described eight word lines are arranged in a matrix array in the redundancy memory mat PR-MAT.

Figure 8:
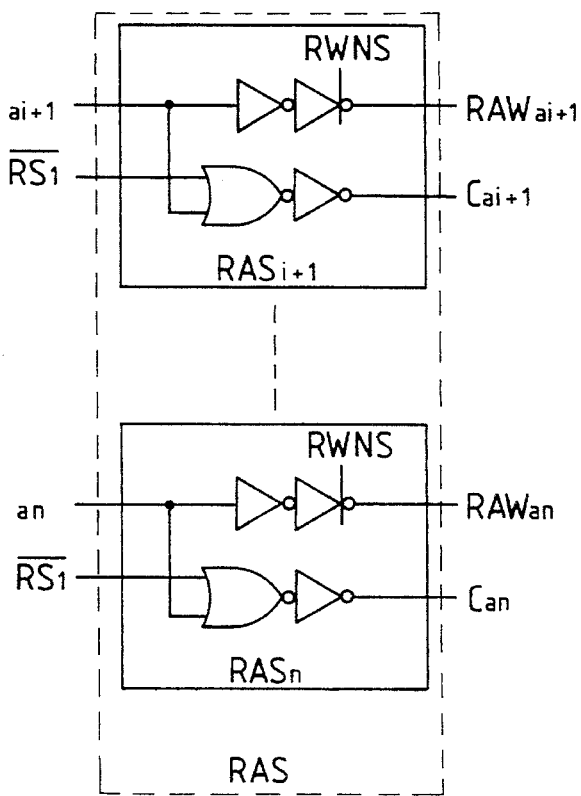
FIG. 8 is a circuit diagram showing an embodiment of redundancy address selector circuit RAS in the above mask ROM.

FIG. 8 shows a circuit diagram of an embodiment of the redundancy address selector circuit RAS.

The redundancy address selector circuit RAS accepts address signals ai+1—an generated by the address buffer circuits ADB receiving the X-system address signals $A_{i+1}$—An and, in response to the signal RWNS activated at the time of writing into the nonvolatile storage element of the redundancy address storage circuit PR-ADD, transmits the input address signals $a_{i+1}$—$a_n$ as write data $RAWa_{i+1}$—$RAWa_n$ to the redundancy address storage circuit PR-ADD. Address signals $Ca_{i+1}$—$Ca_n$ used for comparing the stored redundancy address with the X-system address signals $A_{i+1}$—$A_n$ are generated in earlier assigned redundancy address storage portions.

Figure 9:
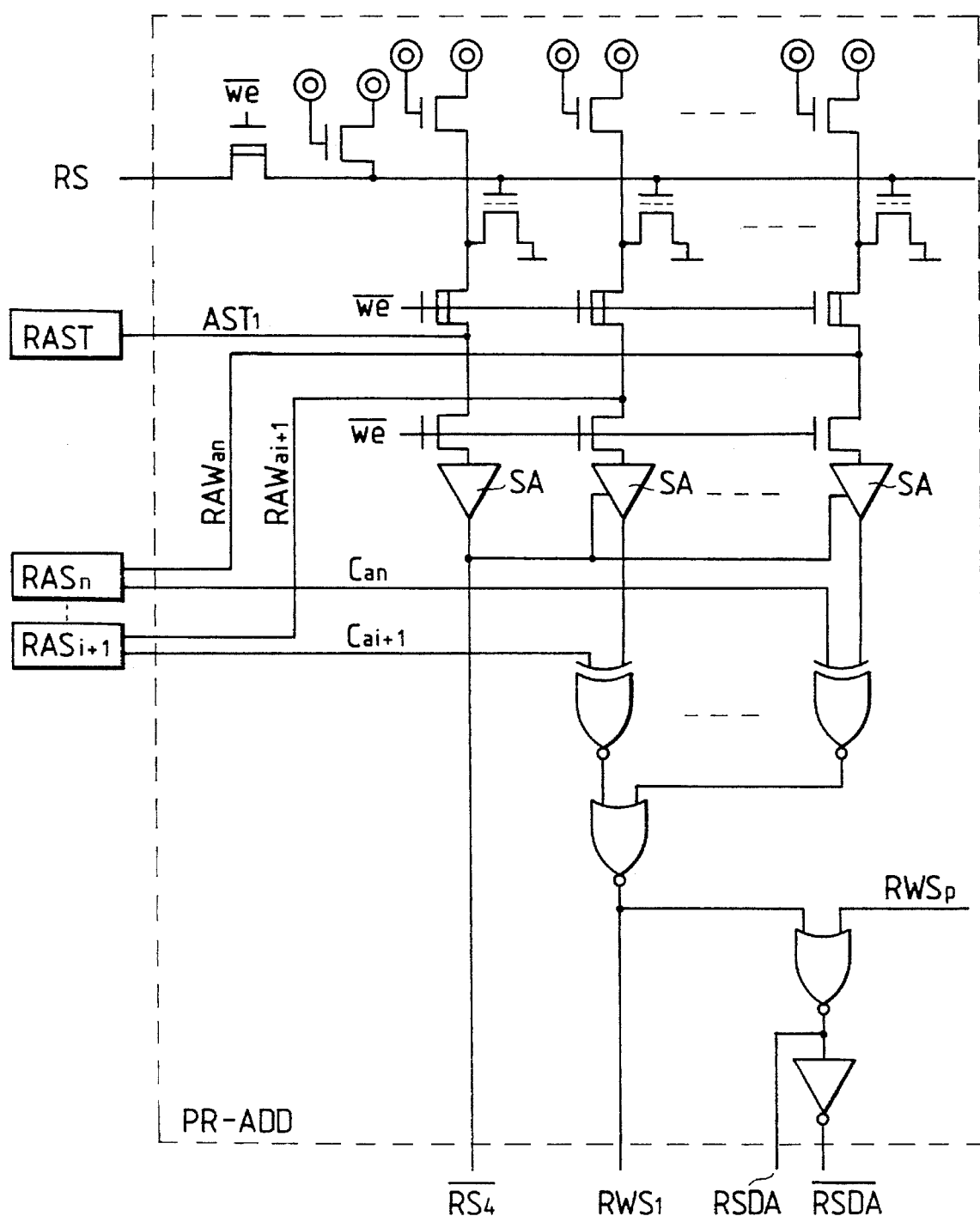
FIG. 9 is a circuit diagram showing an embodiment of redundancy address storage circuit PR-ADD of the above mask ROM.

FIG. 9 shows a circuit diagram of an embodiment of the redundancy address storage circuit PR-ADD.

Writing into the memory elements is performed by transmission of the write signal RS for storing redundancy address to the word line having the above described nonvolatile storage elements of single-layer gate structure, provided as storage elements, coupled thereto and transmission of the storage address data $RAWa_{i+1}$—$RAWa_n$ generated in the redundancy address selector circuit RAS to the data line.

The data line with the memory element storing the redundancy address coupled thereto is connected with the input terminal of the sense amplifier circuit SA and, when the data is read, it is amplified by the sense amplifier circuit SA. In the present embodiment, the memory element for storing redundancy address is, not exclusively, provided with a memory element for one bit additional to the redundancy address. By having arbitrary data of information "1" or "0" stored in the one-bit memory element, whether or not a redundancy address is stored is confirmed and the activation signal of the sense amplifier circuit SA and activation signals $\overline{RS}_1$–$\overline{RS}_p$ for generating the address comparison signals $ca_{i+1}$—$Ca_n$ in the redundancy address selector circuit RAS are generated.

After the redundancy address stored in the memory element has been read out, each output signal of the sense amplifier circuit SA is input to an exclusive disjunction circuit for having agreement/disagreement between the same and the address comparison signal $ca_{i+1}$–$Ca_n$ confirmed. The output of the exclusive disjunction circuit becomes "0" when the output of the sense amplifier circuit SA and the address comparison signal $ca_{i+1}$—$Ca_n$ are in agreement and becomes "1" when they are not in agreement. When all the data of the memory elements storing the redundancy address are in agreement, any one of the redundancy word line selection signals $RWS_1$–$RWS_p$ is activated as the selection signal. Further, when any one of the redundancy word lines selection signals $RWS_1$–$RWS_p$ is selected, the sense amplifier circuit PR-SAM provided for the redundancy memory mat PR-MAT is activated and the switch signal RSAD, $\overline{RSAD}$ to be supplied to the multiplexer MPX is generated.

Figure 10:
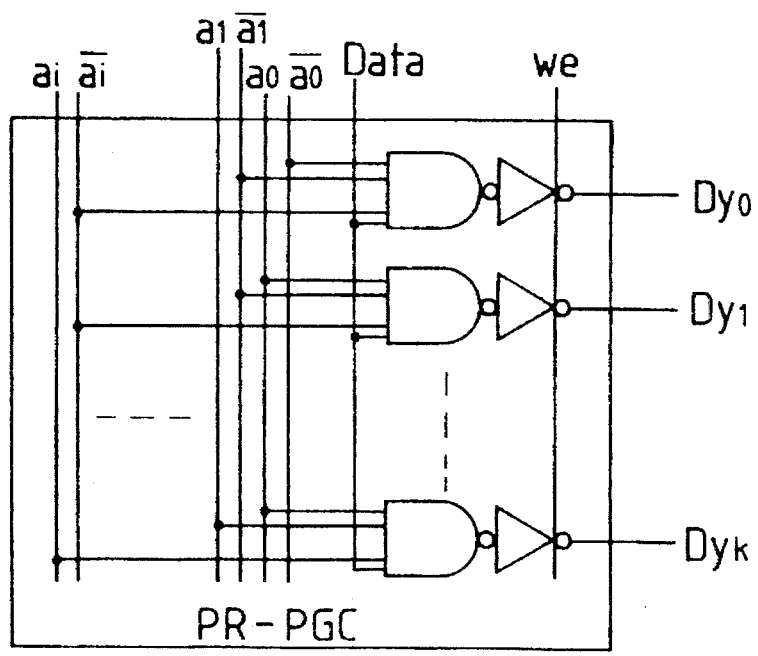
FIG. 10 is a circuit diagram showing an embodiment of write data input circuit PR-PGC in the above mask ROM.

FIG. 10 shows a circuit diagram of an embodiment of the write data input circuit PR-PGC.

This circuit decodes the complementary internal address signals a0, $\overline{a0}$–$a_i$, $\overline{a}_i$ generated by the address buffer circuits ADB accepting the Y-system address signals $A_0$–$A_i$ and data Data and supplies write data $Dy_0$–$Dy_k$ to each of the data lines of the redundancy memory mat PR-MAT.

Figure 11:
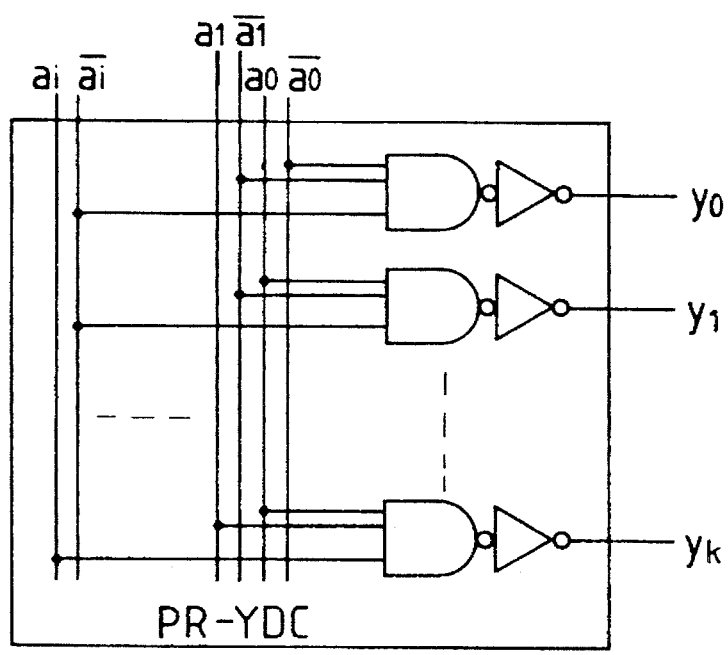
FIG. 11 is a circuit diagram showing an embodiment of Y-decoder circuit PR-YDC for redundancy control in the above mask ROM.

FIG. 11 shows a circuit diagram of an embodiment of the Y-decoder circuit PR-YDC for redundancy side.

The Y-decoder circuit PR-YDC for redundancy side decodes the complementary internal address signals a0, $\overline{a0}$–$a_i$, $\overline{a}_i$ generated by the address buffer circuits ADB accepting the Y-system address signals $A_0$–$A_i$ and generates column selection signals $y_0$–$y_k$ to be supplied to the column switch gate PR-YGT.

Figure 12:
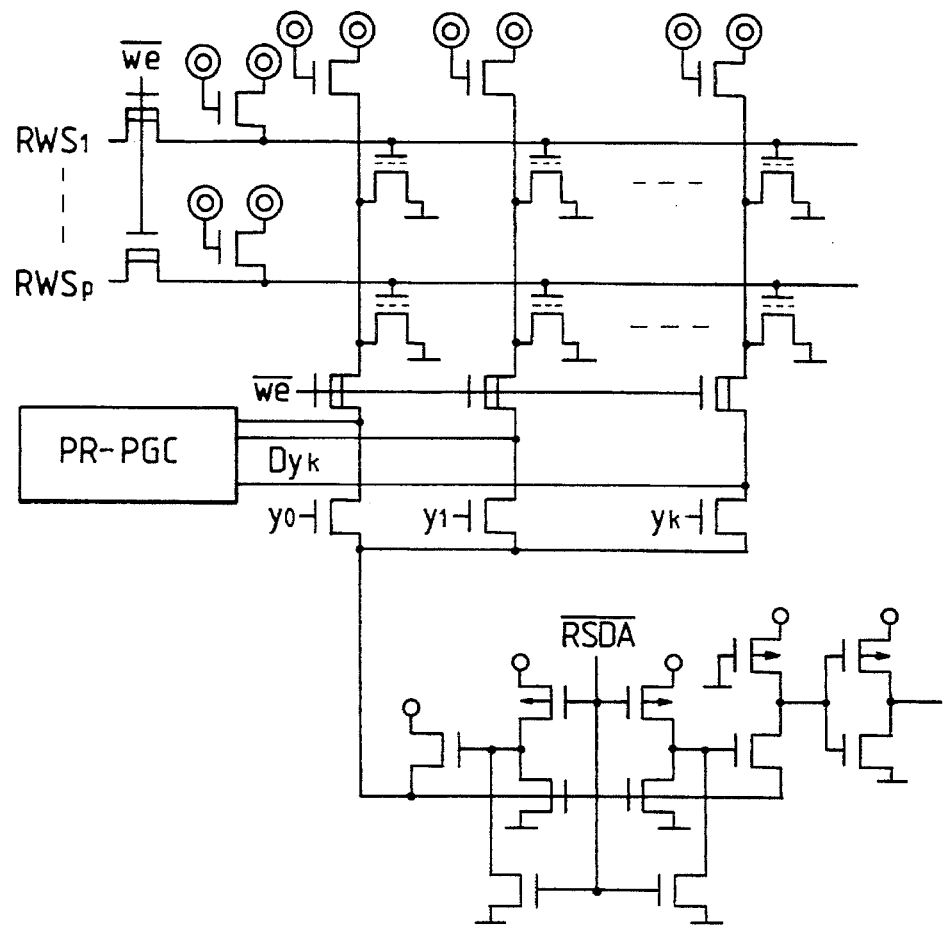
FIG. 12 is a circuit diagram showing an embodiment of a memory mat PR-MAT, a column switch gate PR-YGT, and a sense amplifier circuit PR-SAM for redundancy control in the above mask ROM.

FIG. 12 shows a circuit diagram of an embodiment of the memory mat PR-MAT, the column switch gate PR-YGT, and the sense amplifier circuit PR-SAM for redundancy control.

Figure 13:
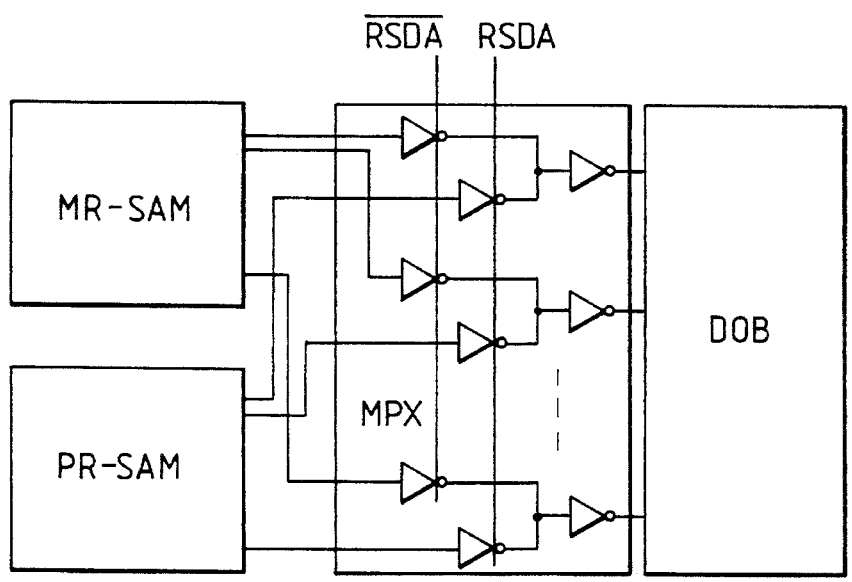
FIG. 13 is a circuit diagram showing an embodiment of multiplexer MPX in the above mask ROM.

FIG. 13 shows a circuit diagram of an embodiment of the above described multiplexer MPX.

In this embodiment, a clocked inverter circuit having a function of providing three-state outputs is used. When a switching signal RSDA for inversion is activated, the clocked inverter circuit receiving the read signal out of the memory element selected by the memory mat MR-MAT constituting the mask ROM is activated and transmits the signal to the output buffer circuit DOB. When a switching signal RSDA for noninversion is activated, the clocked inverter circuit receiving the read signal out of the memory element selected by the redundancy memory mat PR-MAT is activated and transmits the signal to the output buffer circuit DOB. Namely, instead of read data including a defective bit existing in the memory mat MR-MAT, correct data stored in the redundancy memory mat PR-MAT is output.

In the present embodiment, the redundancy word lines are selected for the redundancy control of defective data, but the redundancy address storage circuit PR-ADD may include following function. The redundancy address storage circuit PR-ADD is, not exclusively, adapted to be capable of storing address information of X- and Y-system address signals and memory information, to be stored in the memory mat MR-MAT, corresponding to respective bit. Output data (e.g., "1" or "0") from the redundancy address storage circuit PR-ADD is input to the multiplexer circuit MPX for transmitting the output data to the output buffer DOB, so that the redundancy control of defective data corresponding to only one bit defect is performed without using the redundancy memory mat PR-MAT. Accordingly, size of redundancy is enhanced.

Figure 14:
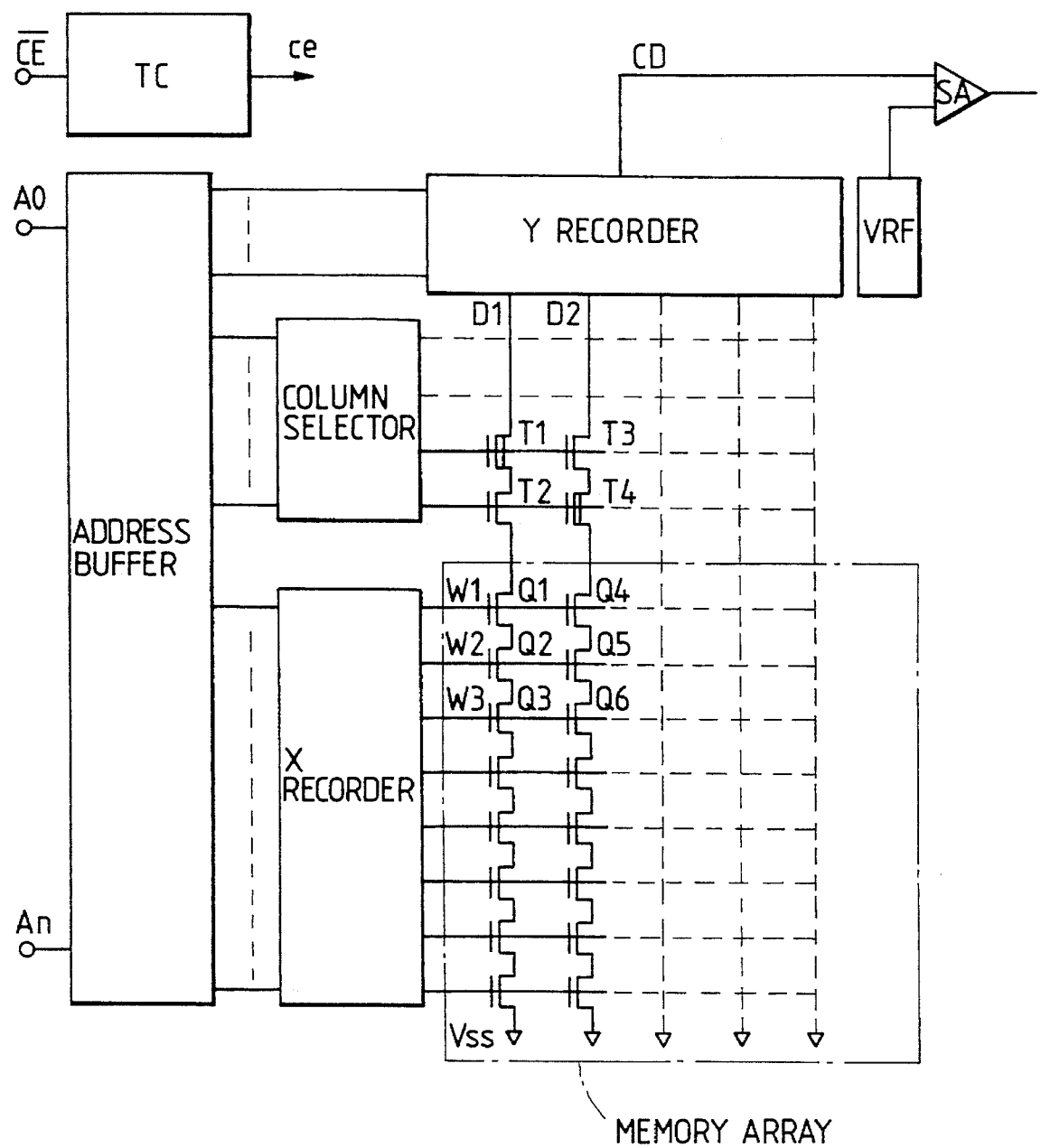
FIG. 14 is a circuit diagram showing another embodiment of mask ROM to which the present invention is applied.

FIG. 14 shows a circuit diagram of another embodiment of mask ROM to which the present invention is applied. The mask ROM according to the present embodiment is constructed of a plurality of series circuits of N-channel type MISFETs for storage. Each of the storage MISFETs Qm is arranged in the depletion mode or the enhancement mode according to storage information. Writing storage information into such memory element is performed by the above described ion injection method. Referring to FIG. 14, the depletion mode MISFETs are shown with a straight line added thereto so as to be distinguished from the enhanced type MISFETs.

The series circuit corresponding to one data line D1 representatively shown by way of example is constructed of MISFETs T1, T2, etc. for column selection and storage MISFETs Q1–Q3, etc. for storing data. The series circuit adjoining to the above, which corresponds to another data line D2 representatively shown by way of example has MISFETs T3, T4 for column selection connected with storage MISFETs Q4–Q6, etc. for storing data.

The MISFETs T1 and T4 for column selection shown by way of example are arranged, for example, in the depletion mode MISFET and the MISFETs T2 and T3 are arranged in the enhancement mode MISFET. In the state where other MISFETs in series, not shown, are ON, if a selection signal supplied from the column selector to the gates of T1 and T3 is at a low level and a selection signal supplied to the gates of T2 and T4 is at a high level, then both T1 and T2 are turned ON and the storage MISFET Q1–Q3, etc. in series are connected to the data line D1. If a selection signal supplied from the column selector to the gates of T1 and T3 is at a high level and a selection signal supplied to the gates of T2 and T4 is at a low level, then both T3 and T4 are turned ON and the storage MISFET Q4–Q6, etc. are connected to the data line D2. Accordingly, it becomes possible to provided a plurality of series circuits, not shown, in parallel with the data lines D1 and D2.

The gates of the storage MISFETs Qm in the horizontal direction of the storage MISFETs in series connections forming the memory array are commonly connected with the word lines W1, W2, W3, etc. representatively shown by way of example. The word lines W1–W3 are connected with the corresponding output terminals of the X decoder.

The data lines D1, D2, etc. are connected with the common data line CD through the Y-decoder. In FIG. 14, the Y-decoder shown includes the Y-decoder proper and a column switch circuit formed of switch elements switch-controlled by the selection signal from the Y-decoder.

The common data line CD is connected with the input terminal of the sense amplifier circuit SA. The sense amplifier circuit SA performs sense-amplification whether high level or low level of the read signal from the selected memory cell using , as a reference, a reference voltage generated by a reference voltage generator circuit VRF.

The sensing operation by the sense amplifier circuit SA may be performed by reference to a reference voltage generated by a dummy array formed of storage circuits similarly to the above described memory array. The dummy array usable will be such that of which storage MISFETs Qm are all-arranged in enhancement mode MISFETs and normally held ON with the power supply voltage Vcc constantly supplied to the gates.

Below will be described address selecting operation in a longitudinal ROM according to the present embodiment.

The X decoder decodes an internal address signal supplied from the row address buffer and generates a decoded output with the selected level set to a low level and the nonselected level set to a high level. For example, when there are 512 word lines, the selected one word line is set to the low level and the remaining 511 word lines are all set to the high level. Thereby, when the storage MISFET coupled with the selected word line is of the depletion mode, a current path is formed in the series circuit and if it is of the enhancement mode, the current path is not formed. The Y-decoder YDCR decodes an internal signal supplied through the address buffer and selects one data line out of, for example, 512 data lines and connects it to the common data line CD. Thereby, one read signal corresponding to one selected data line is amplified by the sense amplifier circuit SA. When the read data is read out in a plurality of bits, such as 8 bits or 16 bits, as a unit, 8 or 16 memory arrays similar to that described above may be provided, or 8 or 16 data lines may be simultaneously selected by the Y-decoder, with corresponding sense amplifier circuits and output circuits provided.

For redundancy control of defects in such longitudinal ROM, the nonvolatile storage elements as described above can be used. As the redundancy address storage circuit and the redundancy memory mat, those circuits shown in the above FIG. 6, etc. can be used.

Figure 15:
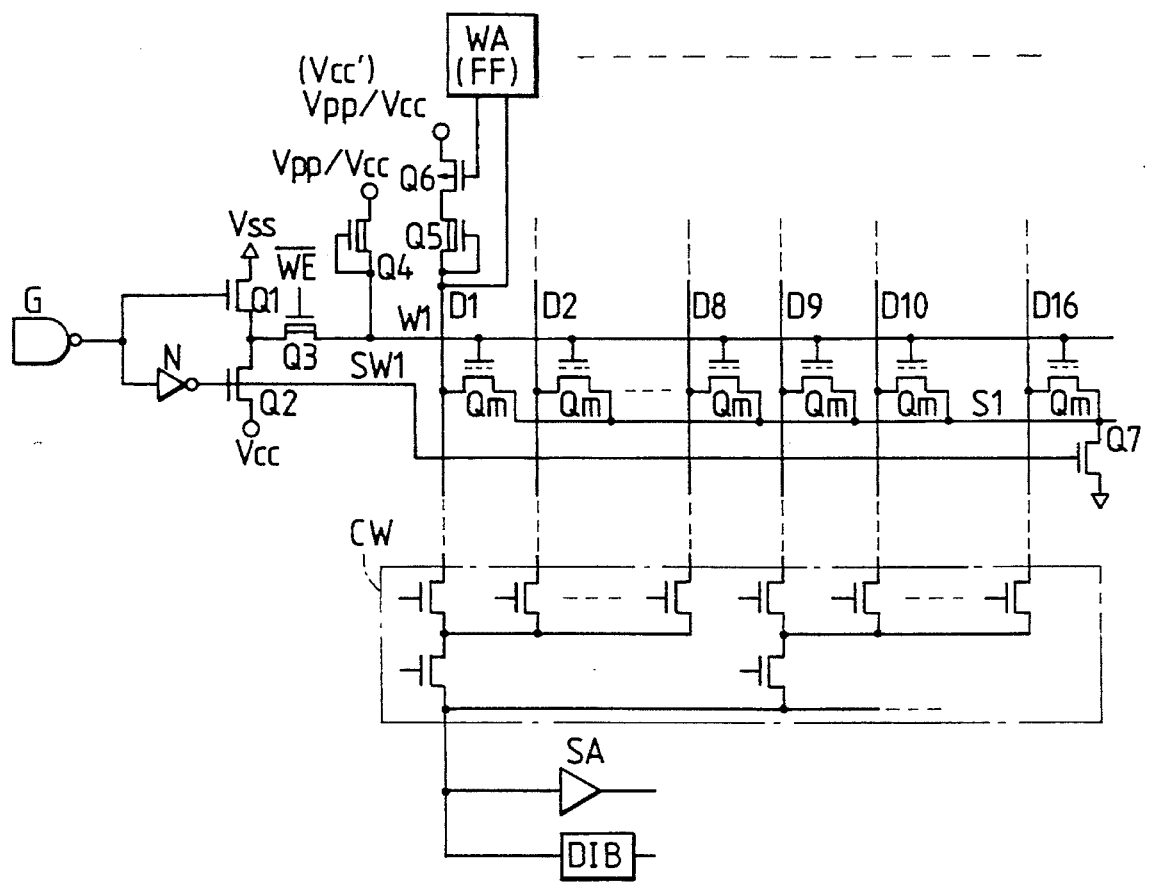
FIG. 15 is a circuit diagram showing another embodiment of redundancy memory mat and its peripheral circuits.

FIG. 15 shows a circuit diagram of another embodiment of redundancy memory mat and its peripheral circuits. Although there are some reference characters given to the components which are the same as those given to the components in FIG. 14, they should be regarded as denoting different components.

In FIG. 15, there are representatively shown one word line

W1 and a plurality of storage elements Qm connected with it by way of example. The selector circuit of the word line W1 is constructed of a ratio type logical circuit. More specifically, a selection signal generated by a NAND gate circuit G is supplied to the gate of an N-channel driving MISFET Q1. The source of the MISFET Q1 is connected with the ground potential of the circuit and, between its drain side and the power supply voltage Vcc, there is provided an N-channel MISFET Q2 accepting the selection signal inverted by a CMOS (Complementary MOS) inverter circuit N. The drain output of the driving MISFET Q1 is connected with the word line W1 through a depletion mode MISFET Q3 having its gate supplied with a write control signal WE. The word line W1 is provided with a depletion mode load MISFET Q4. The power supply terminal with which the depletion mode load MISFET Q4 is connected is supplied with a high voltage Vpp during the write operation and a power supply voltage Vcc as low as 5 V during the read operation.

In the present embodiment, in order to prevent a leak current from flowing through the channel of the storage element provided in an unselected word line during the operation of writing into the storage element Qm due to the potential of the floating gate becoming high on account of the write level of the data line going high, the sources of the storage MISFETs Qm corresponding to the word line are connected with a common source line S1 and the source line is supplied with the ground potential through a switch MISFET Q7.

Since the present embodiment is constituted of a ratio type logical circuit as described above, when the corresponding word line is not selected, the potential of the word line is brought to a higher level than the ground level according to the ratio of conductance of the MISFETs Q1 and Q3 and the load MISFET Q4, and hence the MISFET Q7 cannot be positively turned off. More specifically, during the write operation, the write control signal WE is held low, and in the nonselected state, where the output signal of the gate circuit G is held high, the MISFET Q1 is turned ON and brings the word line to the low level of the ground potential side of the circuit, but this level is held higher than the ground potential according to the ratio between the conductance of the load MISFET Q4 and combined conductance of the MISFETs Q3 and Q1. Accordingly, there is provided a sub-word line SW1 which is supplied with the output signal of the CMOS inverter circuit N1 so that the gate of the switch MISFET Q7 is supplied with the selection signal corresponding to the word line W1. In the present arrangement, when the word line W1 is brought into the nonselected state, the output signal of the CMOS inverter circuit N goes to the level as low as the ground potential and therefore the switch MISFET Q7 can be positively turned OFF.

By the arrangement described above, while the word line W1 is held low and in the nonselected state, a leak current can be prevented from flowing through the storage MISFET Qm provided in the word line W1 unselected and not to be written when writing into the storage element Qm coupled with another word line, not shown, is performed by application of a high level to the data line D1–D16, . . . . Since, thus, no channel current is allowed to flow through the unselected storage element Qm, the withstand voltage of the MISFET is improved. This is because the MIS withstand voltage when the channel current flows is determined by the parasitic bipolar operation constituted of the source, substrate, and drain, which is lower than the MIS withstand voltage determined by the surface breakdown when no channel current flows.

When a word driver for generating a selection signal of a word line is formed of a CMOS circuit, the switch control of the switch MISFET Q7 may be made through the word line W1. In such case, since the potential of the word line during the writing operation is held as high as the high voltage Vpp, the switch MISFET Q7 must be provided with a corresponding high withstand voltage.

In this embodiment, in order to reduce the writing time, write circuits WA having a latch circuit FF, as representatively shown in the data line D1 by way of example, are provided for all the data lines D2–D16 . . . . The storage element Qm is constituted of a nonvolatile storage element of single-layer gate structure as shown in FIG. 1D and FIG. 4. Accordingly, its size becomes such that has a larger occupying area than a nonvolatile storage element of two-layer gate structure. Hence, the pitch between the data lines becomes relatively large so that the write circuits WA can be provided for all the data lines without increasing the pitch between the data lines of the memory mat.

With such arrangement of each data line provided with the write circuit WA, the writing is performed in two steps. More specifically, the writing operation in the first step is that to have the write data stored in the latch circuit FF. At this time, the data input through the data input circuit DIB successively selects the data line by means of the column switch CW whereby data transfer to the latch circuit FF provided therein is achieved. When data transfer to the latch circuits FF corresponding to all the data lines or a predetermined plurality of data lines corresponding to one word line is finished in the described manner, the writing in the second step is started. The writing operation in the second step is performed, with the potential of the selected word line held at the writing high voltage, by switch controlling the switch MISFET Q6 for supplying the writing high voltage to the data line D1 in accordance with the data latched in the latch circuit FF of each write circuit WA thereby injecting electric charges into the floating gate of the storage element Qm.

Since, in this case, write currents flow into the plurality of storage elements simultaneously, the above described provision of the circuit preventing the flow of leak current becomes necessary also for preventing this flow of the write currents from becoming great.

When operations fop writing into the plurality of storage elements are performed simultaneously as described above, also a relatively large amount of current flows into the storage elements Qm causing electric charges to be injected to their floating gates. Hence, it becomes necessary to prevent the wire of the source line S1 from breaking due to migration as a result of the flowing of a large amount of current therethrough. To prevent such braking of wire, the wire of the source line may be made larger in width, but it is not advantageous to increase the width of the wire in terms of achieving higher packaging density. Therefore, a plurality of switch MISFETs Q7 may be provided at regular intervals in the source line S1 so that the write current may be split off. Then, even if the source line is not made so wide, the wire can be prevented from breaking due to such migration.

The writing operations as described above are usually, but not exclusively, performed in the probing step upon completion of circuits on a semiconductor wafer. More specifically, in the probing step, a reading test of the mask ROM is conducted. According to the results of the inspection, defective bits are detected, and thereon, redundancy addresses and storage data corresponding to the redundancy addresses are written. By arranging such writing operations to be performed in the probing step in taking the redundancy measures against defects, the need for providing special control terminal for writing redundancy addresses and corresponding data when the mask ROM is completed can be eliminated.

When the user is enabled to alter or correct data, writing into the semiconductor integrated circuit device becomes necessary after it has been completed. In such case, it may be well to provide suitable external terminals or to provide a three-value input circuit including a high voltage input while using one terminal in a multiplexed manner.

The write voltage given to the data line may be obtained, not by switching from the power supply voltage Vcc to the high voltage Vpp, but by raising the power supply voltage Vcc, which usually is approximately 5 V, to approximately 7 V–8 V, within the limit of the withstand voltage of the MISFET, as shown in FIG. 15 (Vcc'). Since, in this case, the MISFETs Q6 and Q5 in the writing system need not be provided with a high withstand voltage, the fabrication process can be simplified. When the high voltage Vpp is used only as the selection level of the word line at the time of writing, it becomes possible to allow no current to flow from the high voltage terminal and, therefore, the high voltage Vpp can be generated with a relatively simple internal voltage raising circuit.

When the write voltage applied to the data line at the time of writing is relatively low, i.e., around 7–8 V as described above, the writing time becomes relatively long. However, when nonvolatile storage elements of single-layer gate structure are used for redundancy control of defects or alteration of functions as described in the present embodiment, write data is made relatively small in number. Therefore, even if the writing time of unit data becomes somewhat longer, it presents no serious problem.

While the method, whereby the high voltage applied to the drain, in writing into nonvolatile storage elements of single-layer gate structure, is obtained by raising the power supply voltage Vcc to such a high voltage as Vcc', is used in the embodiment of FIG. 15 where a write circuit WA using a latch circuit FF is utilized, such method can of course be applied also to the case where data is input through a pad, an external terminal, or such an external terminal as used in common with other terminal such as the address terminal.

Figure 5:
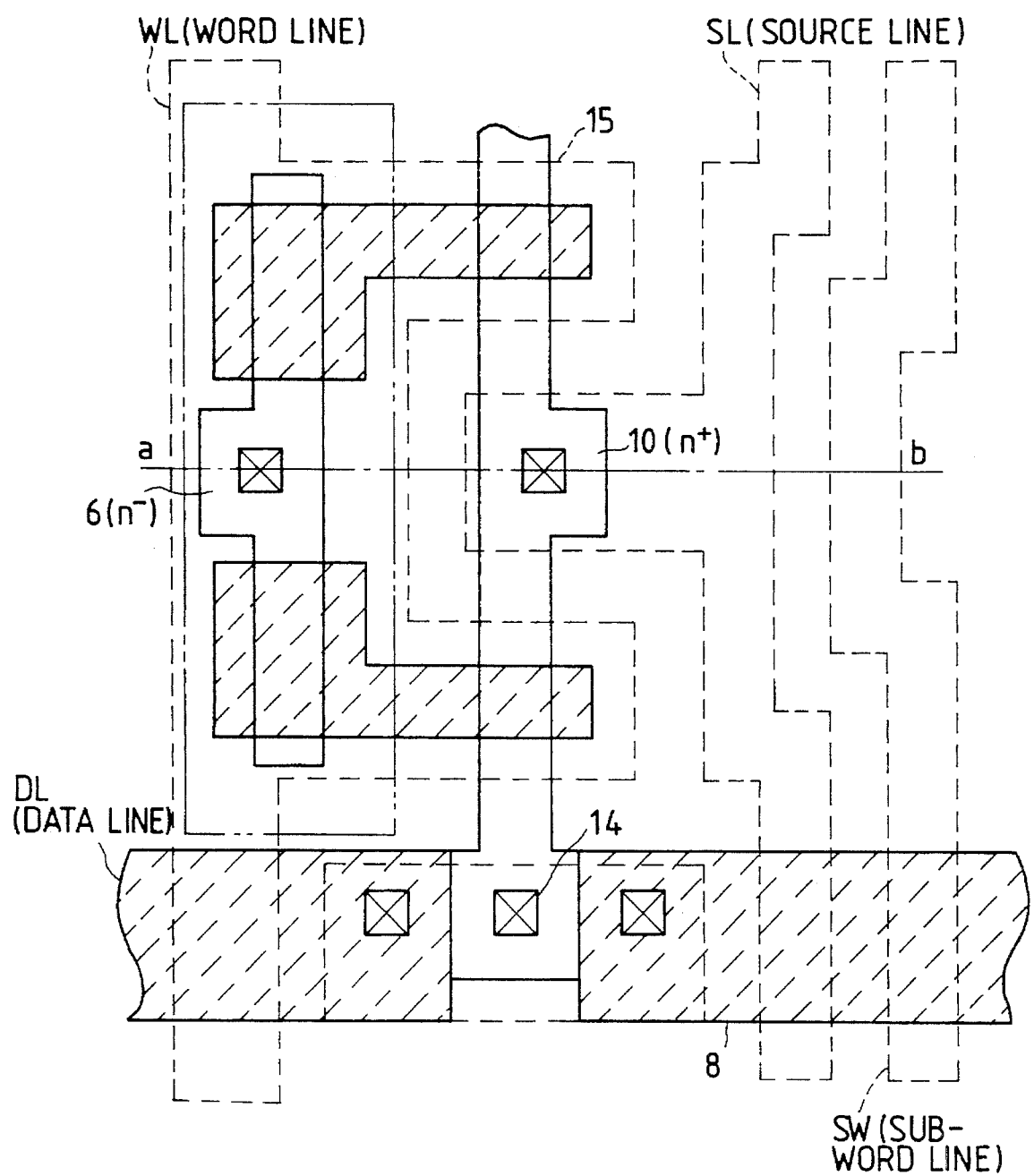
FIG. 5 is a an element pattern diagram showing another embodiment of nonvolatile storage element according to the present invention.

FIG. 5 shows a pattern diagram in an embodiment of the storage element provided with a subword line as described above.

In this embodiment, a sub-word line SW formed of an aluminum layer the same as that of the source line SL is arranged in parallel with the source line SL. In such arrangement including the sub-word line SW, the size of the storage cell tends to become larger accordingly. To prevent this, the source diffused layer is formed smaller and the source line wiring is extended to reach it.

FIG. 17A to FIG. 20B show other embodiments of the present invention. In these embodiments, the whole floating gate is not entirely covered by the barrier layer deposited over the same so that it is partly exposed. That is, the barrier layer is not covering the whole surface of the floating gate but covers only a part of it.

As described earlier, it is preferred to form the barrier layer such that it covers the whole surface of the floating gate in order to improve the data retaining characteristic. However, if it is arranged such that the whole surface of the floating gate is covered, the size of the nonvolatile storage element becomes larger according ly. Therefore, a disadvantage from the point of view of the packaging density is brought about when a large capacity of nonvolatile storage elements of single layer gate structure is required for such a purpose as redundancy control of a mask ROM. Hence, the arrangement in which the floating gate is exposed through the barrier layer is adopted to reduce the size of the nonvolatile storage element. In other words, the barrier layer is arranged not to cover the whole surface of the floating gate. Meanwhile, the word line, data line, or source line is arranged to be partly deformed and extended over the floating gate to an allowable extent. By such arrangement, the exposed floating gate thereby becomes covered, if partially, by the barrier layer and the data retaining characteristic is positively improved accordingly.

The cause whereby the data retaining characteristic is deteriorated is presumed to be the reaction of radical hydrogen from the final passivation layer with the electrons stored on the floating gate leading to reduction in the stored electrons. The rate of reduction in the stored electrons per unit time is considered to be proportional to the product of the electron density on the surface of the floating gate and the density of the radical hydrogen. Accordingly, if the percentage of the exposed floating gate from the barrier layer is decreased, the reaction between the radical hydrogen and the electrons stored on the floating gate is decreased and the rate of reduction in the stored electrons is also decreased. As a result, the above described improvement in the data retaining characteristic is achieved.

Figure 17A:
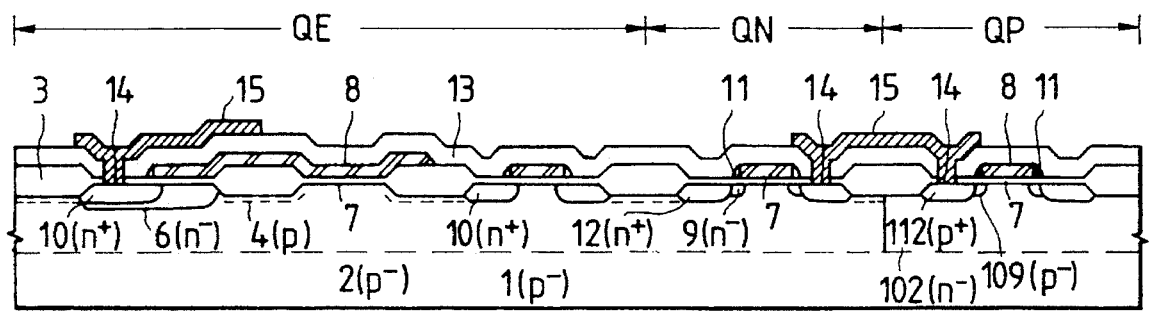
FIG. 17A is an element structure sectional view of another embodiment of nonvolatile storage element according to the present invention.
Figure 17B:
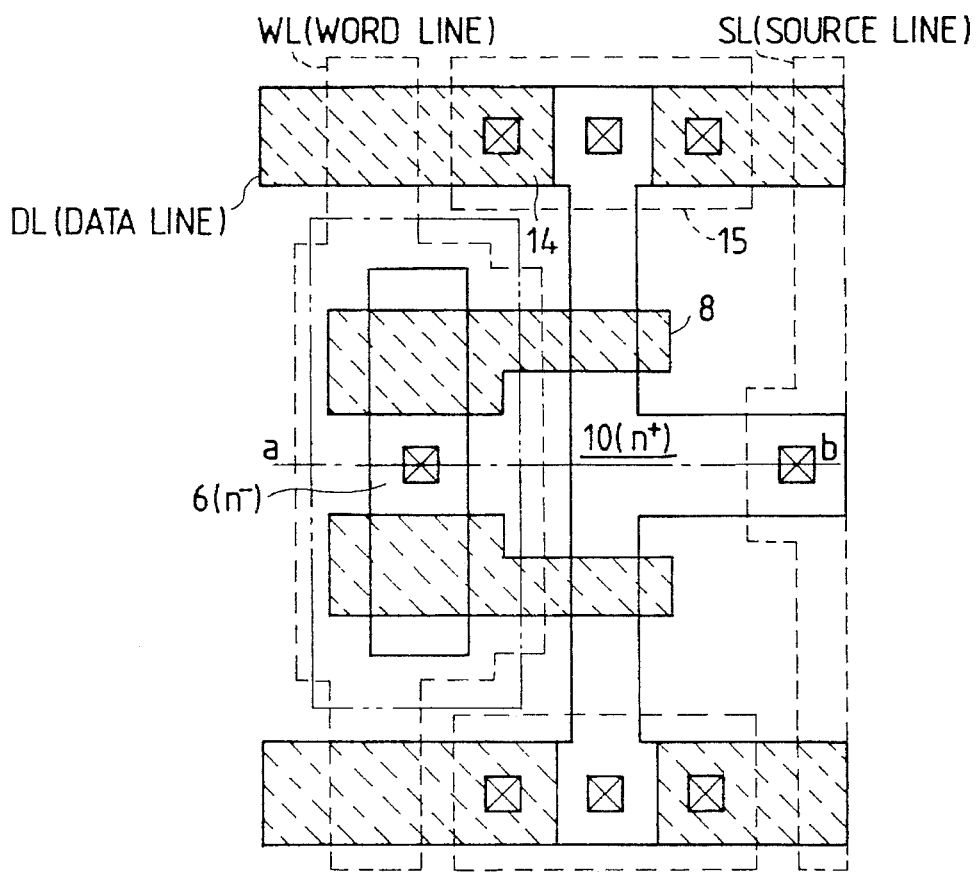
FIG. 17B is a plan view according to the embodiment illustrated in FIG. 17A.

FIG. 17A shows an element structure sectional view of another embodiment of nonvolatile storage element according to the present invention and FIG. 17B shows its plan view.

Referring to FIG.. 17A and FIG. 17B, the aluminum layer 15 forming the word line WL is intentionally extended to the right in the diagram (toward the source line) to be used as the barrier layer for the floating gate 8.

Figure 18A:
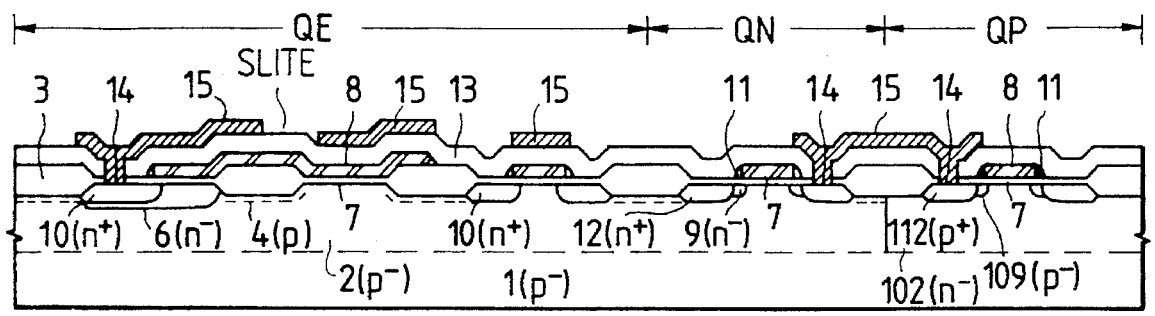
FIG. 18A is an element structure sectional view of another embodiment of nonvolatile storage element according to the present invention.
Figure 18B:
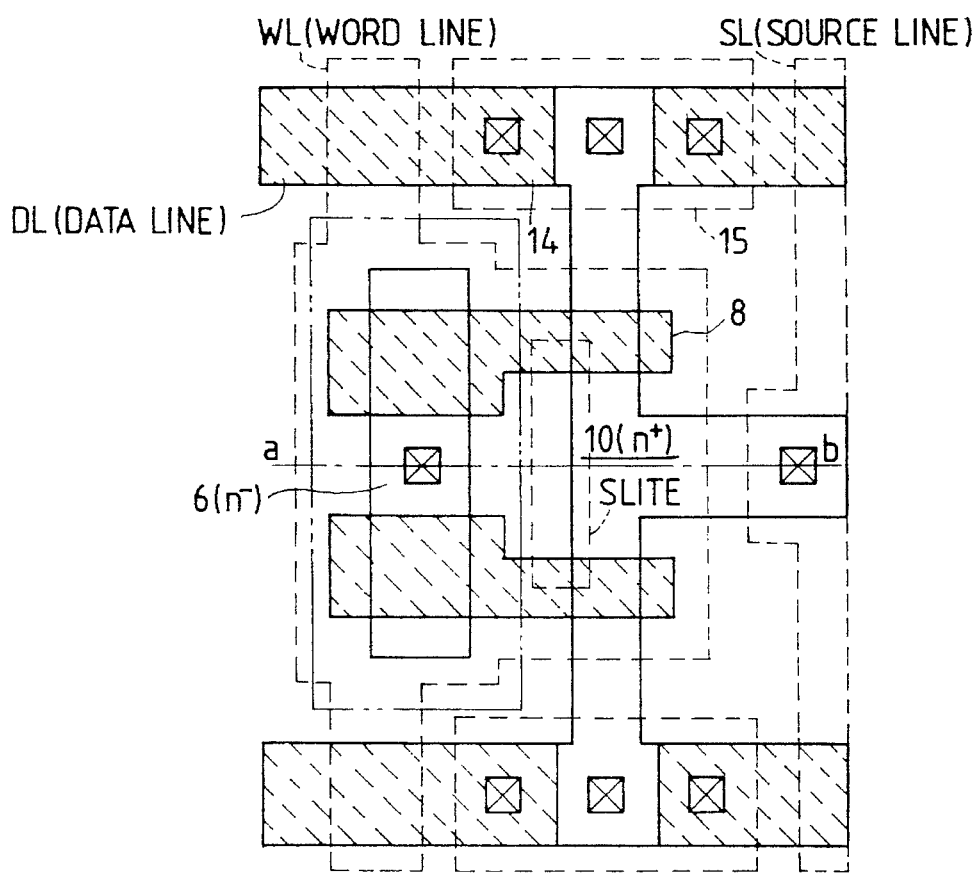
FIG. 18B is a plan view according to the embodiment illustrated in FIG. 18A.

FIG. 18A shows an element structure sectional view of another embodiment of nonvolatile storage element according to the present invention and FIG. 18B shows its plan view.

Referring to FIG. 18A and FIG. 18B, a slit is made in the aluminum layer 15 forming the word line WL and a part of the floating gate 8 is thereby exposed. The slit is usually, but not exclusively, formed in a rectangle arranged in parallel with the word line and having its both ends overlapping with two floating gates. When the word line is extended so as to cover the whole surface of the floating gate to thereby form the barrier layer, the word line becomes wider accordingly. If the word line becomes wider, there is the possibility of the stress from the final passivation film causing cracks to be made in the aluminum layer 15 as the word line, the insulating film 13 provided under the aluminum layer 15, and the like, thereby injuring the characteristics of the element. Therefore, in the present embodiment, the slit is made in the aluminum layer serving as the barrier layer to make its width smaller in substance to thereby prevent occurrence of the above mentioned cracks.

In FIG. 17A to FIG. 18B, the aluminum layer 15 forming the word line WL is extended to cover a portion of the floating gate, but the aluminum layer 15 forming the data line DL or the source line SL may be extended to form a barrier layer to cover the floating gate partially or wholly. A slit may be made therein as in the case described above to prevent occurrence of cracks.

Figure 19A:
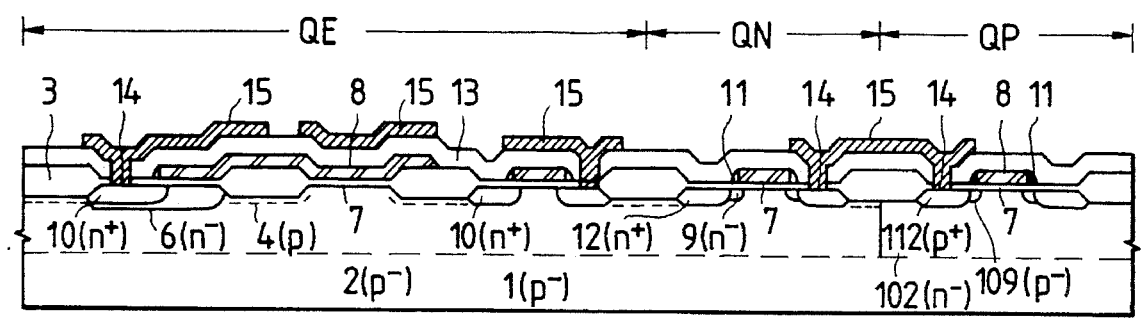
FIG. 19A is an element structure sectional view of another embodiment of nonvolatile storage element according to the present invention.
Figure 19B:
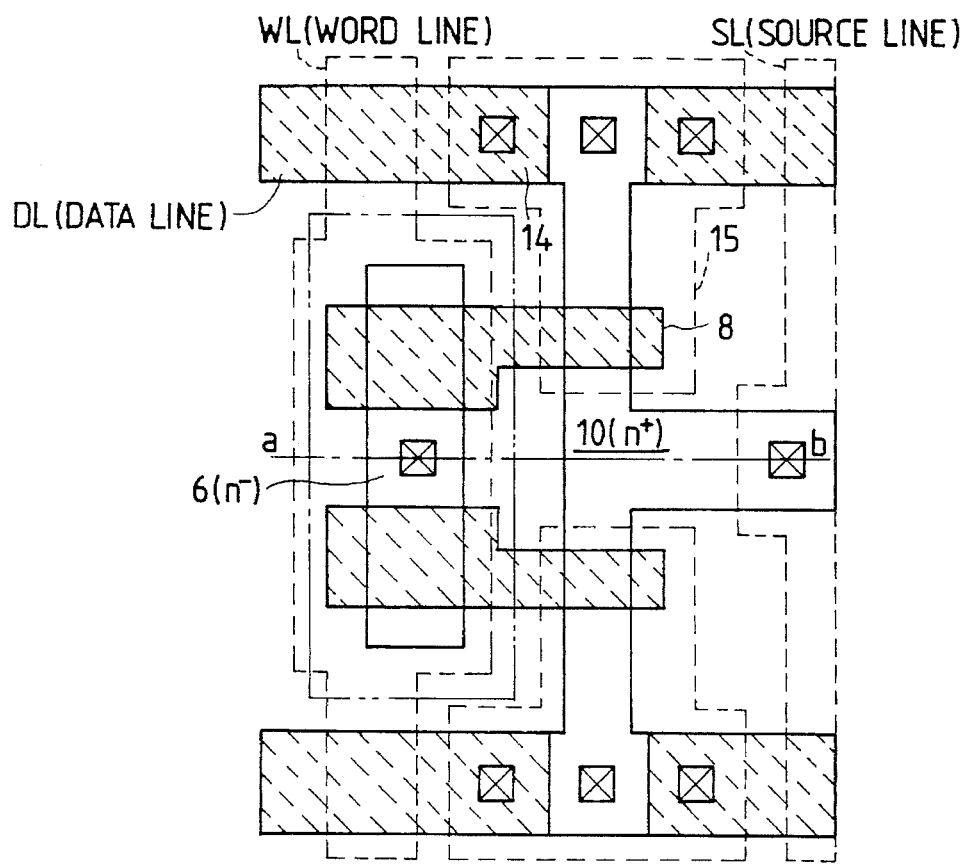
FIG. 19B is a plan view according to the embodiment illustrated in FIG. 19A.

FIG. 19A shows an element structure sectional view of another embodiment of a nonvolatile storage element according to the present invention and FIG. 19B shows its plan view.

Referring to FIG. 19A and FIG. 19B, the aluminum layers 15 forming the word line WL and the data line DL are extended so as to respectively cover portions of the floating gate 8. In such case, the percentage covered by each of the aluminum layers forming the word line WL and the data line DL is small but when both of the word line WL and the data line DL are adapted to function as the barrier layer, the percentage of the surface of the floating gate 8 covered by them is made larger in substance. When barrier layers divided in two are provided as described above, the width of each aluminum layer can be made smaller and hence occurrence of cracks can be prevented without the need for making the slit therein as described above.

Throughout the above described embodiments, the word line WL is formed of the aluminum layer 15 and the data line DL is formed of a conductive layer 8 of polysilicon, polycide, or the like. Such arrangement is advantageous when the number of the nonvolatile storage elements connected with the data line DL is smaller than the number of the nonvolatile storage elements connected with the word line WL. This is because the word line WL is formed of aluminum layer 15 of lower resistance and hence the delay time in the word line WL at the time of reading can be reduced.

Figure 20A:
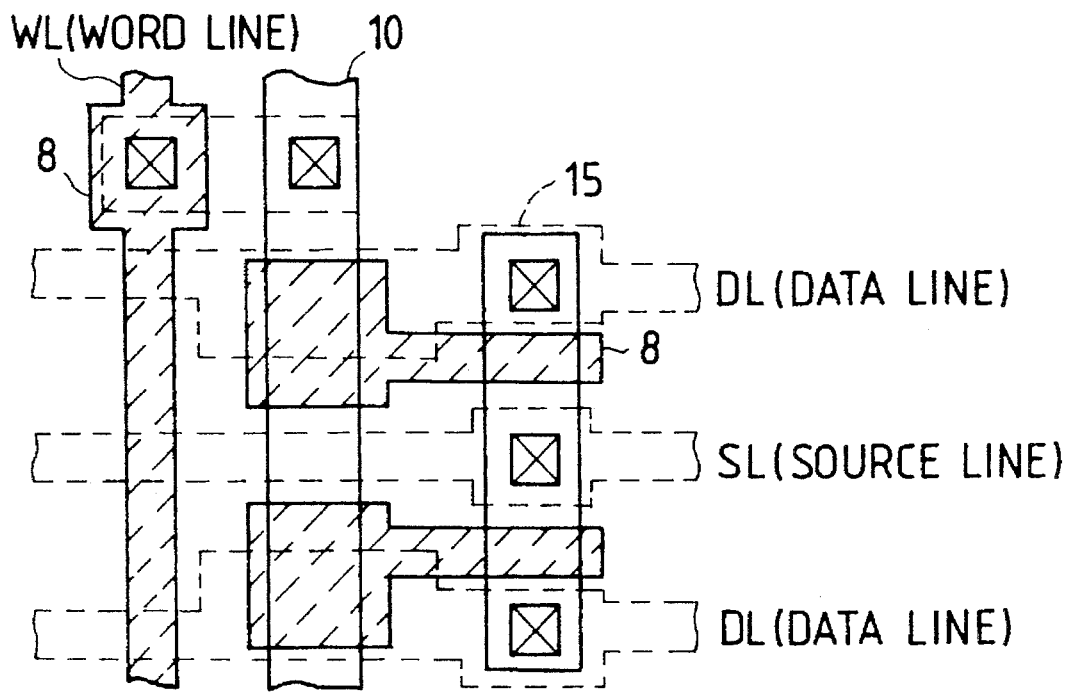
FIG. 20A is a plan view showing another embodiment of nonvolatile storage element according to the present invention.

FIG. 20A shows a plan view of another embodiment of nonvolatile storage element according to the present invention.

In this embodiment, the word line WL is formed of a conductive layer 8 of polysilicon, polycide, or the like. Such arrangement is advantageous when the number of the nonvolatile storage elements connected with the word line WL is smaller than the number of the nonvolatile storage elements connected with the data line DL. The data line DL is formed of the aluminum layer 15 as indicated by broken lines in the plan view. Hence, the aluminum layer 15 forming the data line DL extended so as to cover a portion of the floating gate 8 provides the barrier layer.

Figure 20B:
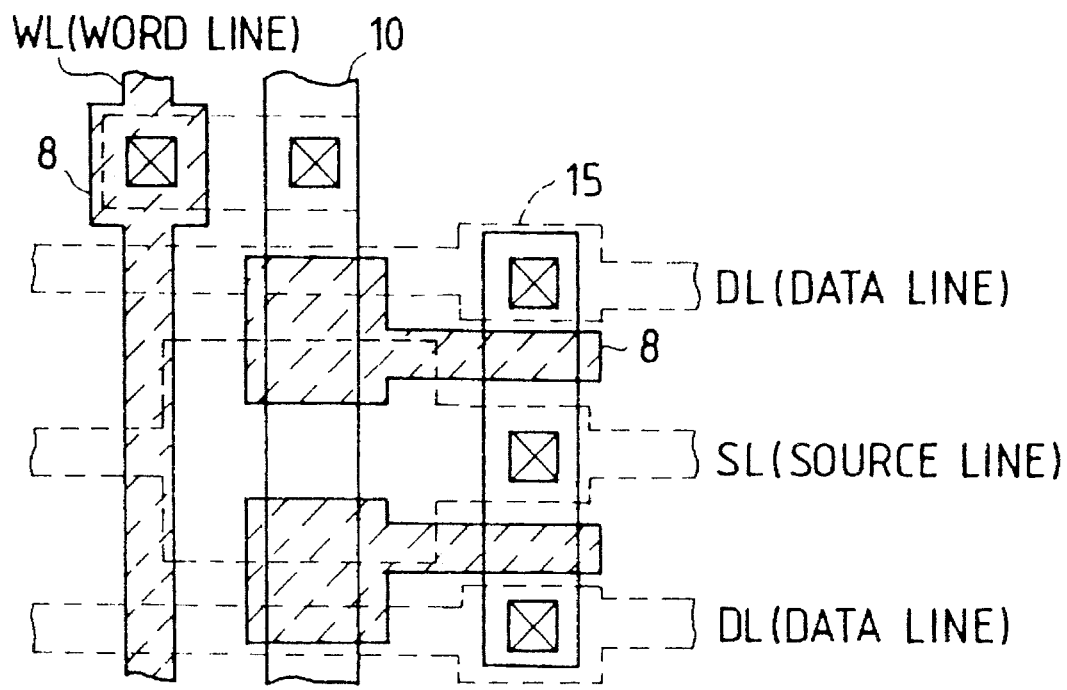
FIG. 20B is a plan view showing another embodiment of nonvolatile storage element according to the present invention.

FIG. 20B shows a plan view of another embodiment of nonvolatile storage element according to the present invention.

In this embodiment, the word line WL is formed of a conductive layer 8 of polysilicon, polycide, or the like. Such arrangement is advantageous when the number of the nonvolatile storage elements connected with the word line WL is smaller than the number of the nonvolatile storage elements connected with the data line DL. The data line DL and the source line SL are formed of the aluminum layer 15 as indicated by broken lines in the plan view. In this embodiment, the aluminum layer 15 forming the source line SL is extended so as to cover portions of the surface of the floating gates 8, which are constituents of the two nonvolatile storage elements provided on both sides of the aluminum layer 15, and provides the barrier layer.

The aluminum layers 15 forming the data line DL and the source line SL may both be extended to jointly cover a part of the floating gate 8 the same as in the embodiment shown in FIG. 19A and FIG. 19B.

FIG. 21A to FIG. 21D show fabrication step sectional views for explaining another embodiment of nonvolatile storage element according to the present invention, inclusive of an N-channel MISFET and a P-channel MISFET fabricated simultaneously.

In this embodiment, different from the nonvolatile storage element shown in FIG. 1A to FIG. 1D, the step for forming the N-type diffusion layer 6 is omitted. More specifically, the control gate of the nonvolatile storage element QE of the present embodiment is formed of an N-type well region 102 (n⁻) constituting the P-channel MISFET QP. Further, in the nonvolatile storage element QE, there is formed an N-type diffusion layer 10 extended to the underside of the floating gate the same as in the nonvolatile storage element QE shown in FIG. 1A to FIG. 1D. Hence, the capacitance coupling between the floating gate and the control gate is determined by the capacitance between the N-type well region 102 and the floating gate and the capacitance between the N-type diffusion layer and the floating gate. Since the capacitance coupling can be made larger than that provided only by the capacitance between the N-type well region 102 and the floating gate, the cell size can be made smaller.

Figure 21A:
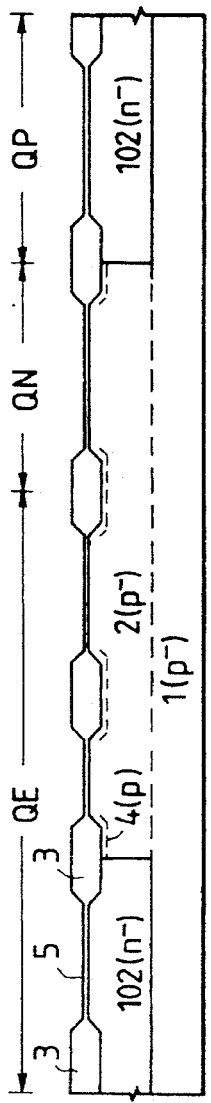
FIG. 21A to FIG. 21D are fabrication step sectional views for describing another embodiment of nonvolatile storage element according to the present invention.
Figure 21B:
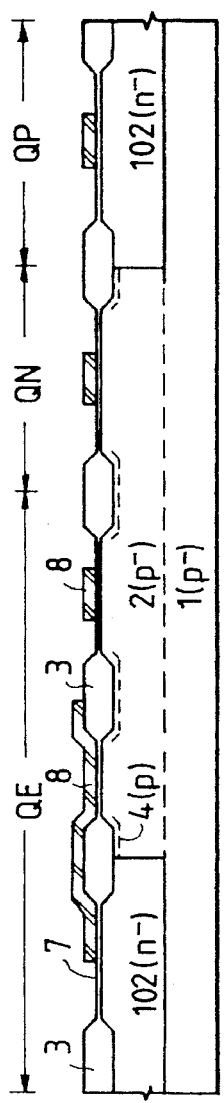
Figure 21C:
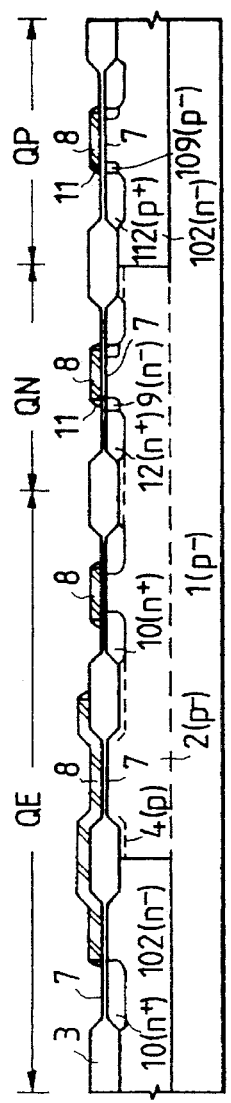
Figure 21D:
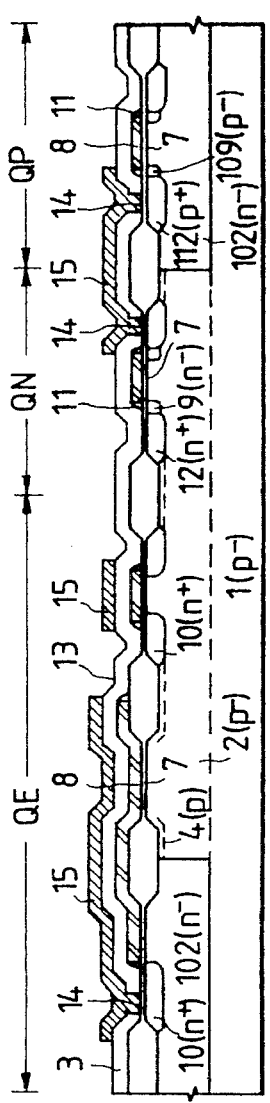

FIG. 21E shows a plan view of the nonvolatile storage element corresponding to FIG. 21A to FIG. 21D. In this case, when an N-channel MISFET of the depletion mode is formed on the same semiconductor substrate, the capacitance between the N-type well region 102 and the floating gate can be made still larger by injecting N-type impurity used for providing the depletion mode. Of course, the control gate can be formed only of the N-type well region 102. Otherwise, without using the N-type well region 102, a diffused layer extended to the underside of the floating gate such as the N-type diffused layer 10 may be used as the control gate.

While the N-type well region formed on a P-type semiconductor substrate is used as the control gate in the present embodiment, when an N-type semiconductor substrate is used, the nonvolatile storage element may be of a PMOS structure using a P-type well region as the control gate, or various other modifications may be made.

According to the present embodiment, a nonvolatile storage element of which the control gate is formed of a diffused layer can be obtained without adding any fabrication step and, hence, the element can be applied to any type of semiconductor integrated circuit device.

In the nonvolatile storage element of the present embodiment, the distances for separating the N-type well region from other diffused layers such as the N-type diffused layer 10 becomes longer and, hence, its cell size becomes larger than that of the embodiments shown in FIG. 4, FIG. 5, etc. However, when the nonvolatile storage elements are only used for address conversion, as in the case of redundancy control of a RAM as described later, a large number of elements are not required and hence the increase in the cell size to a certain extent presents no problem.

Figure 22A:
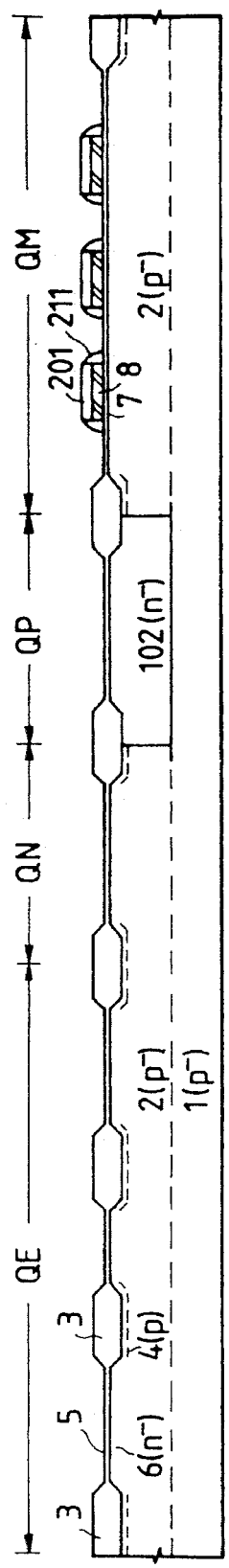
FIG. 22A to FIG. 22C are fabrication step sectional views for describing yet another embodiment of nonvolatile storage element according to the present invention.
Figure 22B:
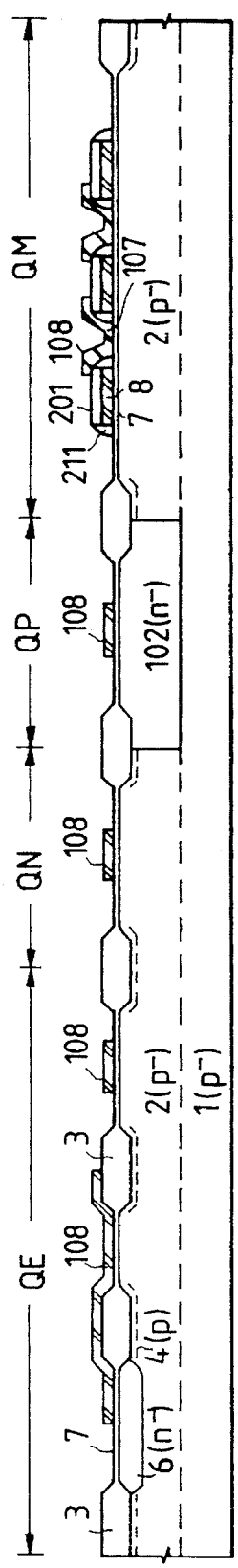
Figure 22C:
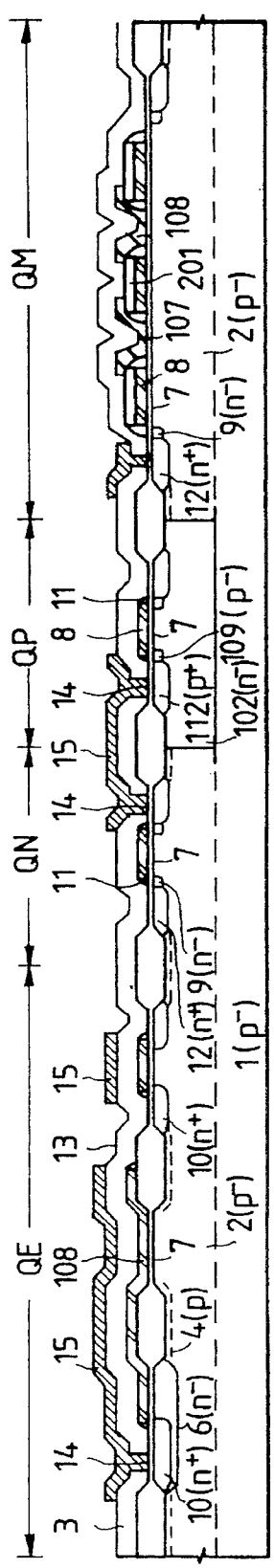

FIG. 22A to FIG. 22C show fabrication step sectional views for explaining yet another embodiment of the nonvolatile storage element according to the present invention inclusive of the simultaneously fabricated N-channel MISFET and P-channel MISFET, as well as a storage MISFET QM constituting a mask ROM of two-layer gate structure.

In this embodiment, in order to improve the packaging density of the mask ROM, adjoining word lines are formed of different conductive layers 8 and 108. More specifically, of a plurality of storage MISFETs in a serial arrangement, the word line of odd-numbered MISFETs is formed of a polysilicon layer 8 of the first layer and the word line of the even-numbered MISFETs is formed of a polysilicon layer 108 of the second layer. By arranging the adjoining word lines in such two-layer gate structure, the intervals between the word lines (the pitch between the storage MISFETs) is made narrower in substance and the packaging density can thereby be improved. Even in this case, the nonvolatile storage element QE for use in the redundancy control of defects is arranged in a single-layer gate structure with the control gate formed of a diffused layer. The nonvolatile storage element is thus arranged in the single-layer gate structure, though the polysilicon layer is arranged in the two-layer structure, for the following reason. The gate insulating film provided between the polysilicon layer of the first layer and that of the second layer in the nonvolatile storage element of two-layer gate structure is essentially different from that in the mask ROM which is similarly of two-layer gate structure. While, in the two-layer gate structure of the mask ROM, the insulating film is only required to electrically separate the gate of the second layer from that of the first layer, the insulating film in the nonvolatile storage element of two-layer gate structure must be a thin insulating film controlled so that its film quality and film thickness satisfy required writing /reading characteristics. Therefore, in the case of the nonvolatile storage element of two-layer gate structure, a special fabrication step needs to be added for forming the insulating film between the floating gate and control gate. According ly, by using the nonvolatile storage element of single-layer gate structure as described above, redundancy control of defects or the like can be achieved without increasing the number of fabrication steps in substance.

In the step of FIG. 22A, the first MISFET of the mask ROM made up of the N-type diffused layer 6 becoming the control gate, the first gate insulating film 7, and the first gate electrode 8 are formed the same as in the embodiment shown in FIG. 1A to FIG. 1D. For the sake of insulation from the second MISFET of the mask ROM, insulating films 201 and 202 are formed on the top and side faces of the first gate electrode 8.

In the step of FIG. 22B, the second MISFET of the mask ROM made up of the second insulating film 107 and the second gate electrode 108 are formed. In the present embodiment, the floating gate of the nonvolatile storage element QE and the gate electrodes of the N-channel MISFET QN and the P-channel MISFET QP constituting peripheral circuits of the mask ROM are formed of the conductive layer 108 of the second layer. These gate electrodes may of course be formed of the conductive layer 8 of the first layer.

As shown in FIG. 22C, each circuit element is completed the same as in the earlier described embodiment. In FIG. 22C, the passivation film is not shown.

In this embodiment, the fabrication process can be simplified by forming the nonvolatile storage element in the single-layer gate structure, though the semiconductor integrated circuit device proper is formed in the two-layer gate structure.

Figure 23A:
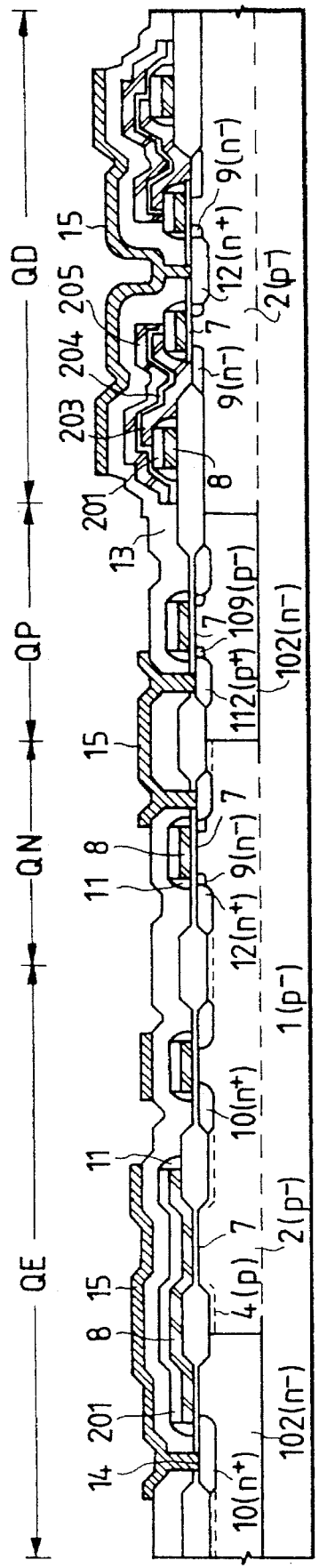
FIG. 23A and FIG. 23B are each an element structure sectional view showing an embodiment of semiconductor integrated circuit device in the case where nonvolatile storage elements of single-layer structure are used for redundancy control of a dynamic RAM.
Figure 23B:
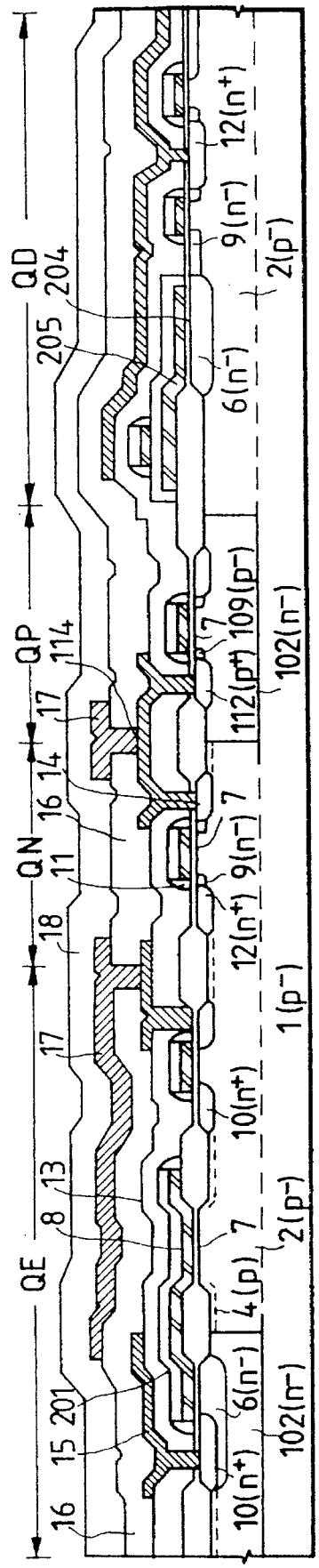

FIG. 23A and FIG. 23B show element structure sectional views of embodiments of semiconductor integrated circuit device in which nonvolatile storage elements of single-layer gate structure are used for redundancy control of a dynamic RAM.

The dynamic type memory cell shown in FIG. 23A has the capacitor for information storage made up of a conductive layer 203, a dielectric film 204, and a conductive layer 205, i.e., it is formed in the so-called STC structure. The dynamic type memory cell shown in FIG. 23B has the capacitor for information storage made up of an N-type diffused layer 6, a dielectric film 204, and a conductive layer 205, i.e., it is formed in the so-called planar structure. In the drawings, the passivation film is not shown.

In either of the embodiments of FIG. 23A and FIG. 23B, the nonvolatile storage element of single-layer gate structure has the control gate formed of an N-type well region 102 the same as the embodiment shown in FIG. 21A to FIG. 21E and, hence, there is added no fabrication step. Since the redundancy control of the dynamic RAM is achieved only by address conversion, the number of required nonvolatile storage elements becomes smaller and hence there is presented no problem in essence even if the cell size becomes larger.

Figure 23C:
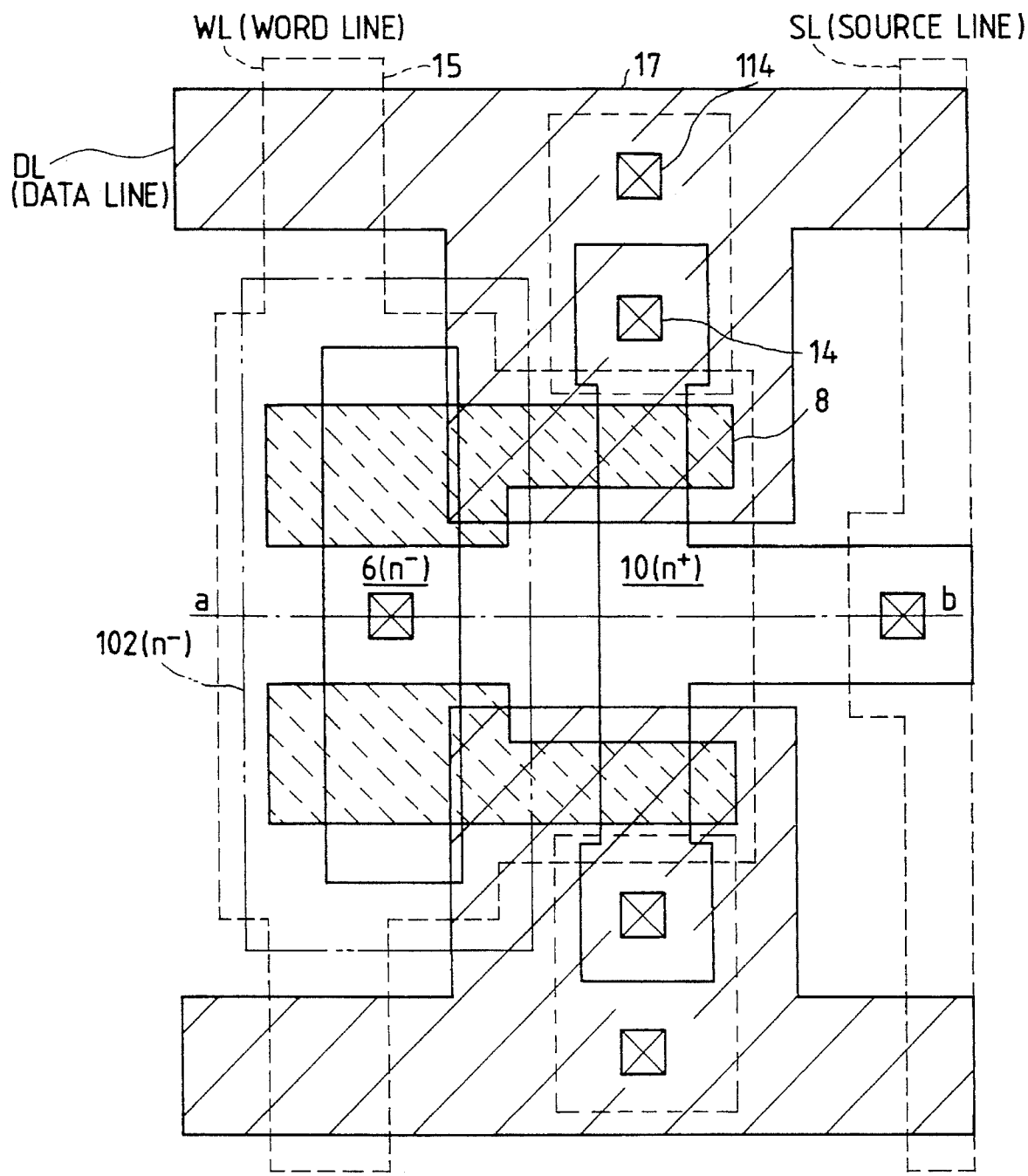
FIG. 23C is a plan view corresponding to FIG. 23B.

When the element is provided with two layers of wiring layers 15 and 17, the whole surface of the floating gate of the nonvolatile storage element is covered, as shown in the sectional view of FIG. 23B and the plan view of FIG. 23C, by the combination of two layers of the wiring layers 15 and 17. That is, in this embodiment, the word line WL is formed of the aluminum layer 15 of the first layer and the data line DL is formed of the aluminum layer 17 of the second layer. Accordingly, the aluminum layers 15 and 17 of the two layers overlap each other and covers the floating gate provided thereunder.

Figure 23D:
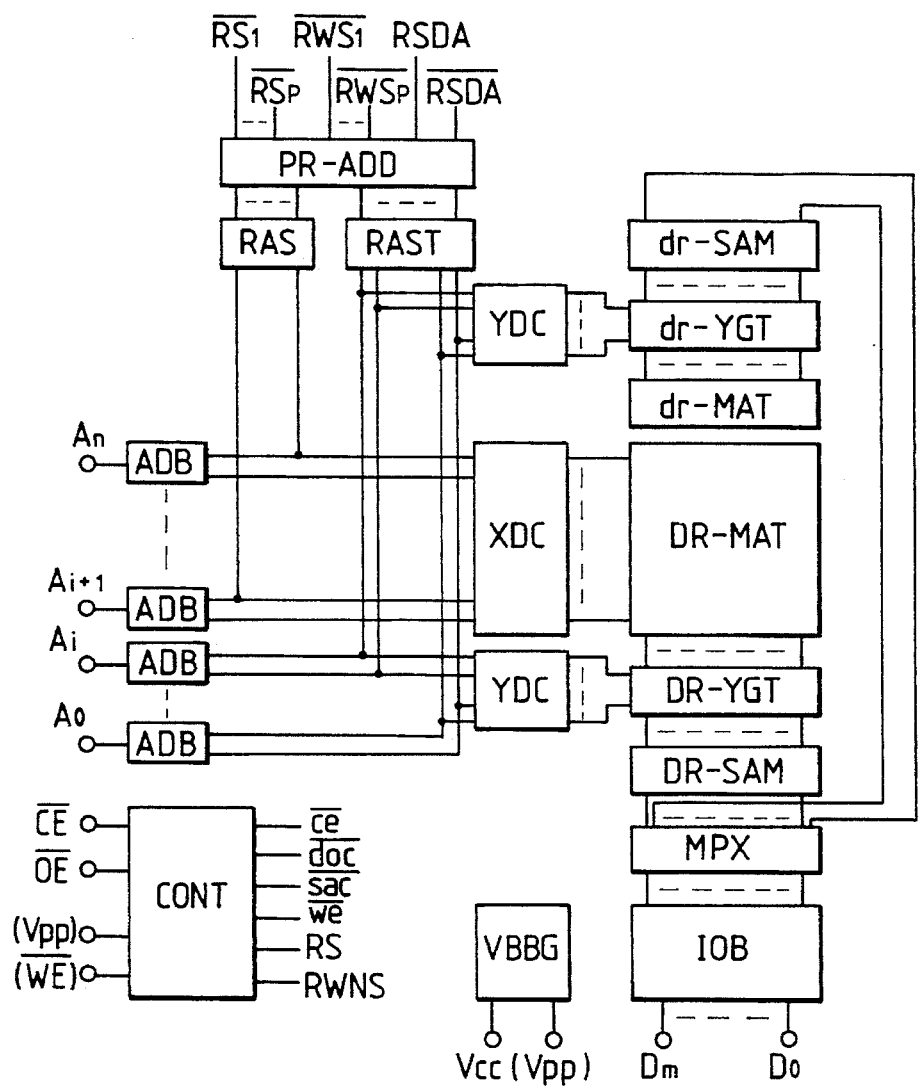
FIG. 23D is a block diagram showing an embodiment of dynamic RAM incorporating a redundancy defect-control circuit formed of nonvolatile storage elements according to the present invention.

FIG. 23D shows a block diagram of an embodiment of a dynamic RAM incorporating a defect controlling redundancy circuit structured of nonvolatile storage elements according to the present invention.

The memory portion of the dynamic RAM is made up of a memory mat DR-MAT, a Y-gate circuit DR-YGT, and a sense amplifier circuit DR-SAM. The memory mat DR-MAT is structured of memory cells, each of which is formed of information storage capacitor as shown in FIG. 23A or FIG. 23B and a transfer MISFET for address selection, arranged in a matrix array. In the case of the dynamic RAM, no nonvolatile storage elements into which data must be written later such as those in the mask ROM are not required, and hence the redundancy circuit portion is made up of a backup (redundancy) memory mat dr-MAT structured of the same memory cells as those of the memory mat DR-MAT arranged in a matrix array, a Y-gate circuit dr-MAT, and a sense amplifier circuit dr-SAM. The dynamic RAM incorporates a substrate bias generator circuit VBBG. Therefore, excepting that the backup memory mat dr-MAT is using the same nonvolatile memory cells as those of the memory mat DR-MAT, that there is no circuit for writing into the backup memory mat dr-MAT, and that there is the substrate bias generator circuit, redundancy control of the dynamic RAM can be performed in the same way as in the address conversion in the mask ROM.

At the time of writing into the nonvolatile storage element, the substrate bias generator circuit VBBG is, not exclusively, deactivated and the semiconductor substrate is set to the ground potential. This is done, since a high voltage is applied to the control gate of a diffused layer formed on the semiconductor substrate, for preventing the voltage at the PN junction from becoming too high. Thus, writing into the nonvolatile storage element of single-layer gate structure which uses the diffused layer as the control gate becomes achievable without providing the PN junction with a specially high withstand voltage.

As a matter of course, the redundancy control of defects for the dynamic RAM in the present embodiment can be applied to redundancy control of defects for the static RAM.

Figure 24:
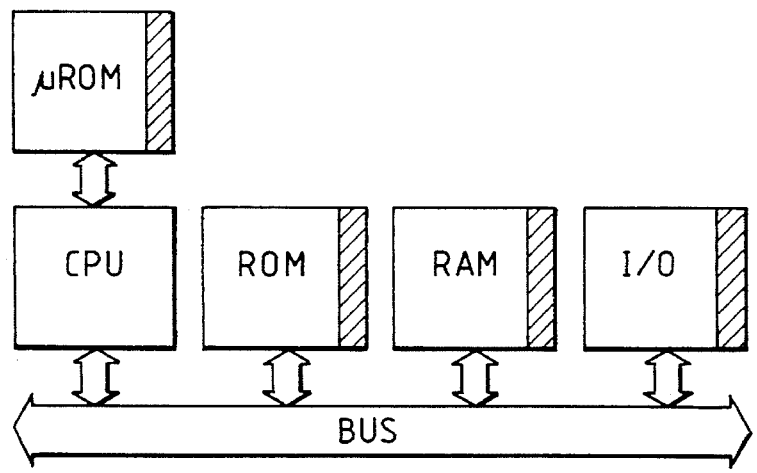
FIG. 24 is a block diagram showing an embodiment with nonvolatile storage elements according to the present invention used for redundancy control or the like of a microcomputer.

FIG. 24 shows a block diagram of an embodiment of nonvolatile storage elements of single-layer gate structure according to the present invention applied to redundancy control or the like of a microcomputer.

The microcomputer in the present embodiment is made up of a CPU (microprocessor), a ROM, a RAM, and an I/O (Input/Output) port, and these circuit blocks are mutually connected through a BUS. The CPU is provided with a μ ROM (microprogram ROM). Redundancy circuits are indicated by hatching in each of the μ ROM, ROM, RAM, and I/O port. These redundancy circuits are arranged in similar structure to that of the circuits shown in FIG. 6 to FIG. 15. In the μ ROM and ROM, nonvolatile storage elements are used for both address conversion and data storage, while in the RAM, nonvolatile storage elements are used for address conversion. The method of redundancy control in these circuits is similar to that in the above described embodiments and therefore its explanation will be omitted. In the I/O port, such switchover as between TTL level inputting and outputting and CMOS level inputting and outputting is performed. According to the present embodiment, redundancy control of logical blocks mounted on the microprocessor or logical switchover in the I/O port can be easily achieved by the use of nonvolatile storage elements of single-layer gate structure with the control gate formed of a diffused layer.

It is further possible to provide backup buses and, when some bus becomes defective, to change the address of the logical blocks connected with such bus.

Figure 25:
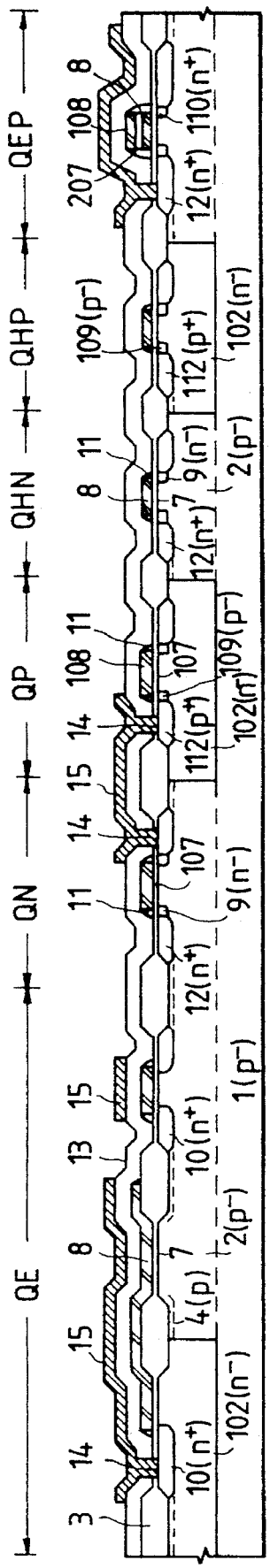
FIG. 25 is an element structure sectional view showing an embodiment with nonvolatile storage elements of one-layer gate structure according to the present invention mounted on an EPROM of a conventional two-layer gate structure.

FIG. 25 shows an element structure sectional view of an embodiment of nonvolatile storage elements of single-layer gate structure according to the present invention mounted on an EPROM of conventional two-layer gate structure.

The control gate of the nonvolatile storage element QE of single-layer gate structure according to the present invention is formed of an N-type well region 102 for which no fabrication step need not be added the same as above. The N-channel MISFET QHN and the P-channel MISFET QHP are high withstand voltage MISFETs used for writing into the nonvolatile storage element (EPROM) QEP of two-layer gate structure and formed of the first gate insulating film 7 and the first gate electrode 8. The N-channel MISFET QN and the P-channel MISFET QP are MISFETs used at an ordinary operating voltage and formed of the second gate insulating film 107 and the second gate electrode 108. The nonvolatile storage element QEP of two-layer gate structure is made up of a floating gate formed of the first gate electrode 8 and the control gate formed of the second gate electrode 108 provided over the floating gate through the insulating film 207.

When redundancy control only for the above described EPROM of two-layer gate structure is performed, it is a simpler way to use the EPROM of two-layer gate structure also for the nonvolatile storage elements for redundancy control. In such a case as of a microcomputer shown in FIG. 24, the EPROM in which data can be easily changed is used as the data ROM at the early stage of product development, but once the data are determined, the mask ROM which is lower in price but has the same performance is used. Then, if the redundancy control is performed with the EPROM of two-layer gate structure, it becomes necessary to change the EPROM of two-layer gate structure to the nonvolatile storage element of single-layer gate structure. Consequently, debugging of the redundancy circuit or a great change in the chip layout becomes necessary. Therefore, in such case, the portion of redundancy circuit is structured of the circuit including nonvolatile storage element of single-layer gate structure from the beginning . By so doing, a microcomputer in which the data ROM is changed from the EPROM of two-layer gate structure to the mask ROM can be easily obtained. This is also advantageously applied to the case where the nonvolatile storage elements to be mounted on a microcomputer are small in number. The technology for fabricating a microcomputer in which the EPROM is changed to the mask ROM is disclosed, for example, in U.S. Ser. No. 362,249 filed Jun. 6, 1989 at the U.S. Patent Office.

Content of this reference is incorporated herein by reference.

Figure 26A:
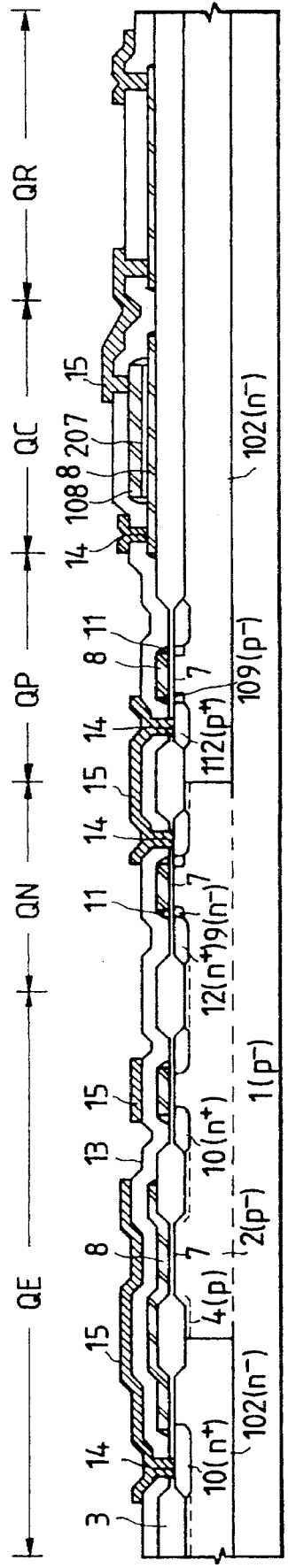
FIG. 26A is an element structure sectional view showing an embodiment with the nonvolatile storage elements according to the present invention used for trimming for a semiconductor integrated circuit device including an analog circuit.
Figure 26B:
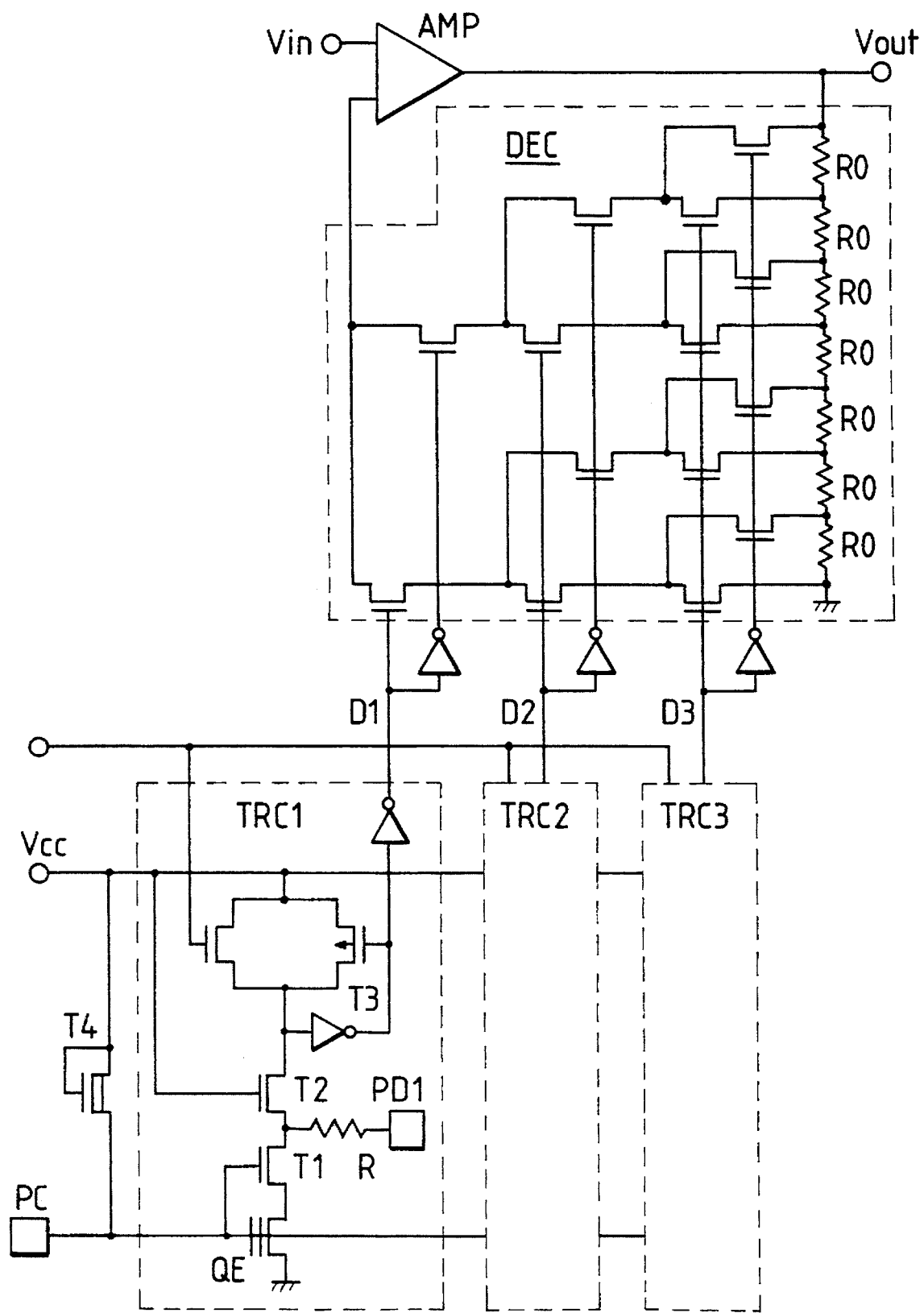
FIG. 26B is a circuit diagram showing an embodiment of the trimming circuit.

FIG. 26A shows an element structure sectional view of an embodiment of the nonvolatile storage element according to the present invention used for trimming of a semiconductor integrated circuit device including an analog circuit and FIG. 26B shows a circuit diagram of an embodiment of such trimming circuit.

The semiconductor integrated circuit device including an analog circuit is made up, as shown in FIG. 26A, of the N-channel MISFET QN and P-channel MISFET QP constituting an operational amplifier circuit AMP for the digital portion and analog portion, the capacitor element QC, and the resistor element QR.

The trimming circuit shown in FIG. 26B is for performing trimming of the reference voltage used in the analog circuit which sets an internally generated voltage Vin to a desired voltage Vout according to three-bit data. Between the voltage Vout and the ground voltage, there is a series circuit of resistors R0 and terminals of each of the resistors are connected with another terminal of the operational amplifier AMP through a decoder DEC. The decoder DEC is operated according to the data generated by trimming circuits TRC1 to TRC3 so that the resistance ratio is changed and the trimming is achieved.

First, the PC terminal is set to the ground potential and a predetermined set of data is input to the terminal PD, whereby the data for trimming is determined. Then, the terminal Vcc is set to the ground potential, the write voltage Vpp is applied to the terminal PC, and the previously determined data is input to the terminal PD, thereby writing into the nonvolatile storage element QE is performed.

In the present embodiment, data was input through a resistor R directly from the terminal PD, but it may be input the same as in the above described embodiment. Otherwise, it may be well to provide only one terminal for inputting data and perform writing by changing serial data to parallel data by means of a shift register.

A semiconductor integrated circuit device including an analog circuit is frequently operated by a battery of approximately IV. The threshold voltage before writing into a nonvolatile storage element QE is usually IV or so. In this state, it is unachievable to determine whether it is before or after writing . In such case: (1) the gate voltage of the nonvolatile storage element QE is raised to a voltage, 3 to 5 V, for example, with which it can be achieved to determine whether it is before or after writing , (2) it is arranged such that the state before writing becomes the depletion mode and that after writing becomes the enhancement mode, and reading is performed with the gate voltage set to the ground potential; or (3) it is arranged such that the state before writing becomes the enhancement mode by a later described method, and that after writing becomes the depletion mode, and the reading is performed with gate voltage set to the ground potential.

Figure 27A:
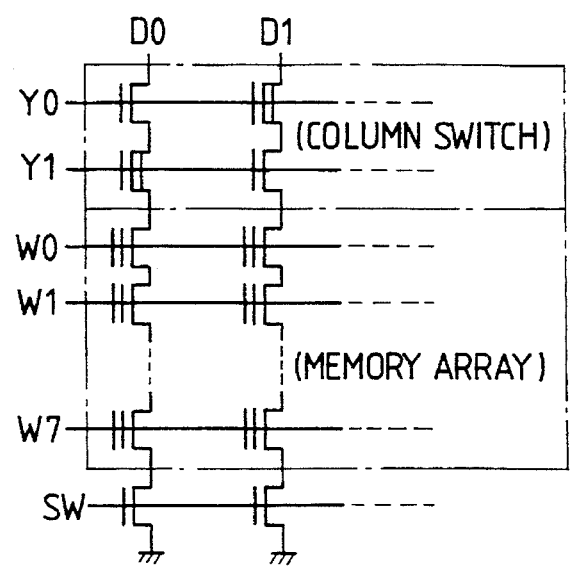
FIG. 27A is a circuit diagram showing an embodiment of memory array in a longitudinal arrangement using nonvolatile storage elements according to the present invention.
Figure 27B:
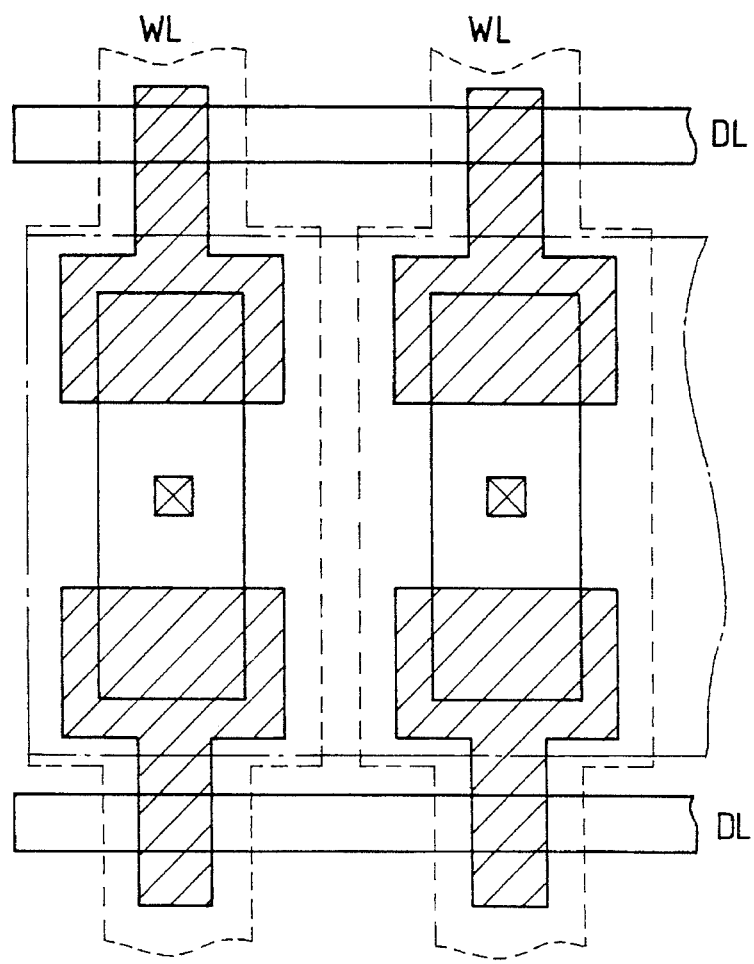
FIG. 27B is a plan view showing an embodiment of the memory cell used in the embodiment, illustrated in FIG. 27A.
Figure 27C:
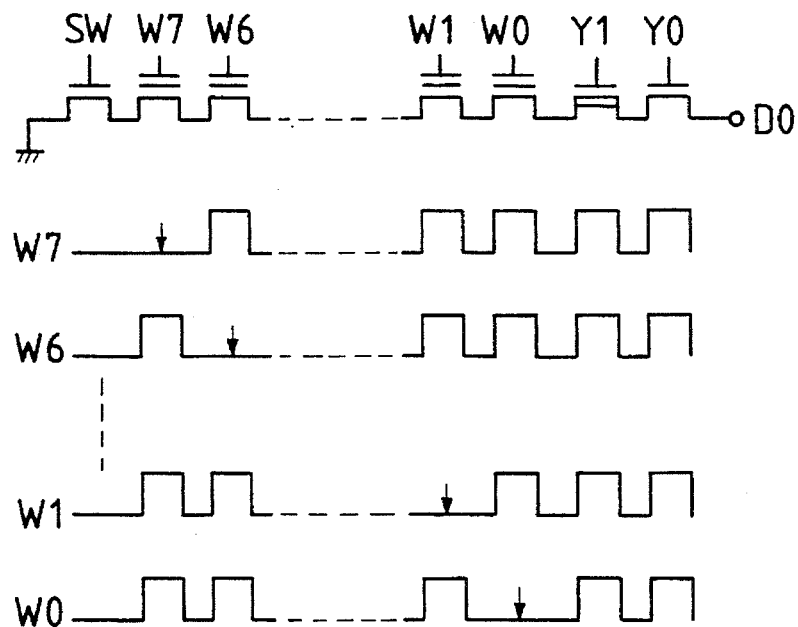
FIG. 27C is a principle diagram showing in an embodiment a method for writing into the same.

FIG. 27A shows a circuit diagram of an embodiment of memory array provided in a longitudinal (NAND) arrangement using nonvolatile storage elements according to the present invention, FIG. 27B shows a partial plan view of the same, and FIG. 27C shows a principle diagram of the writing method.

Referring to FIG. 27A, the memory array in the NAND arrangement has nonvolatile storage elements serially connected. On the side of the data lines (or bit lines) D0, D1, there are disposed MISFETs constituting a column switch, and between the other side and the ground potential point of the circuit, there are disposed switch MISFETs. Basically, this arrangement is the same as the arrangement of the longitudinal mask ROM except that the storage MISFET is the nonvolatile storage element and there are provided the switch MISFETs.

Referring to FIG. 27B, the word line WL formed of a vertically extended aluminum layer is commonly put in contact with the diffused layer forming the control gate corresponding to the adjoining two data lines DL, and the control gates given hatching and overlapping with the diffused layer is extended to cross over the horizontally extended data line DL constituting the source and drain, and thus, the nonvolatile storage elements of single-layer gate structure in series connection are structured. By adopting such layout, the occupied area is reduced to approximately 42% of that of the conventional lateral (NOR) arrangement.

Referring to FIG. 27C, writing is performed in succession from the source side of the nonvolatile storage elements in series connection. Then, in order that no DC current flows through the series circuit at the time of writing, the control signal SW is brought to such a low level as the ground potential so that the switch MISFET is turned OFF. Further, in the initial state, the threshold voltage of the nonvolatile storage element is set to have a positive voltage (enhancement mode).

In the above described state, writing into the nonvolatile storage elements is started from that connected with the word line WT, that is, the word line W7 is brought to such a low level as the ground potential, while the other word lines W6 - W1 and the control voltage Y0, Y1 for the column switches are brought to a relatively high voltage. When the write data D0 is at a low level, no electric field acts between the control gate and the drain and, hence, no tunnel current flows from the floating gate to the drain and the above described threshold voltage (Vth>0) is held unchanged. On the other hand, when the write voltage DO is at a high level of a relatively high voltage, a high electric field acts between the control gate and the drain and thereby a tunnel current is caused to flow from the floating gate to the drain and the threshold voltage is change to Vth<0.

Thereafter, writing is similarly performed by bringing the selected word line to the low level in the order of W6 - W0. In such writing operation, since no current other than the tunnel current flows, the write current becomes smaller and current clamping as is necessary in the NOR type arrangement becomes unnecessary and, thereby the circuit configuration becomes simpler.

At the time of reading, the control signal SW is brought to a high level and the switch MISFET is turned ON. In this state, since the conventional memory cells are in whether depletion mode or enhancement mode depending on the storage information, the reading can be performed the same as in the conventional longitudinal ROM.

Figure 28:
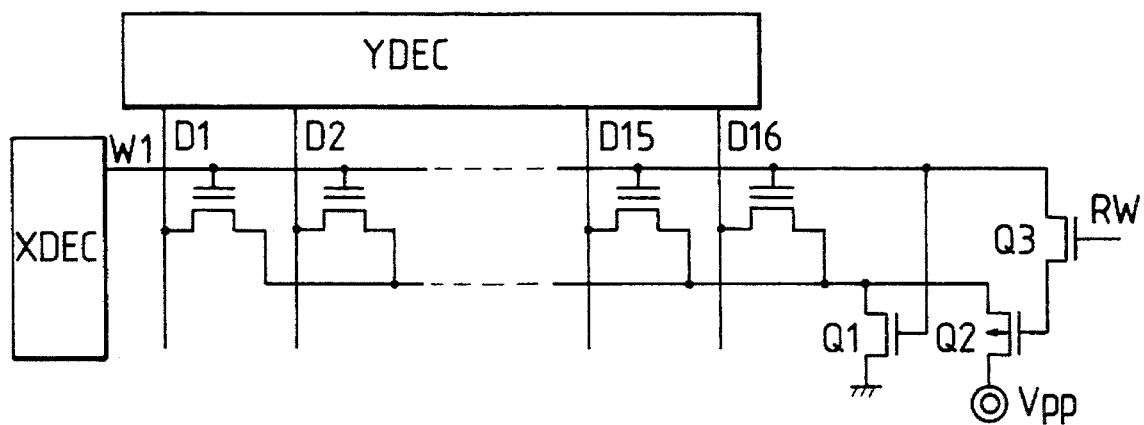
FIG. 28 is a circuit diagram showing an embodiment of an arrangement in which a nonvolatile storage element according to the present invention is adapted to be electrically erased.

FIG. 28 shows a circuit diagram of an embodiment of an arrangement using the nonvolatile storage element according to the present invention adapted to be electrically erasable.

In this embodiment, writing of data is performed using hot carriers the same as in the conventional EPROM and erasing of data is performed utilizing the tunnel current the same as shown in FIG. 27C. That is, the data writing is performed the same as shown in FIG. 15. In the case of the data erasing, the word line of the nonvolatile storage element which is desired to be erased is brought to a low level. Thereby, the P-channel MISFET Q2 is turned ON and provides the high level (Vpp) to the source line so that a high electric field acts between the control gate and the source virtually the same as described in FIG. 27C and a tunnel current is caused to flow between the floating gate and the source. The MISFET Q3, in accordance with the control current RW, is turned OFF at the time of writing and turned ON at the time of erasing. The MISFET Q1 is turned ON upon selection of the word line.

At the time of reading, the source of the nonvolatile storage element connected with the unselected word line is brought into an open state in accordance with the MISFET Q1 being then in the OFF state. Therefore, even if the nonvolatile storage element is over-erased and brought into a depletion mode, no leak current flows through the storage element and there arises no problem in the reading.

Figure 29A:
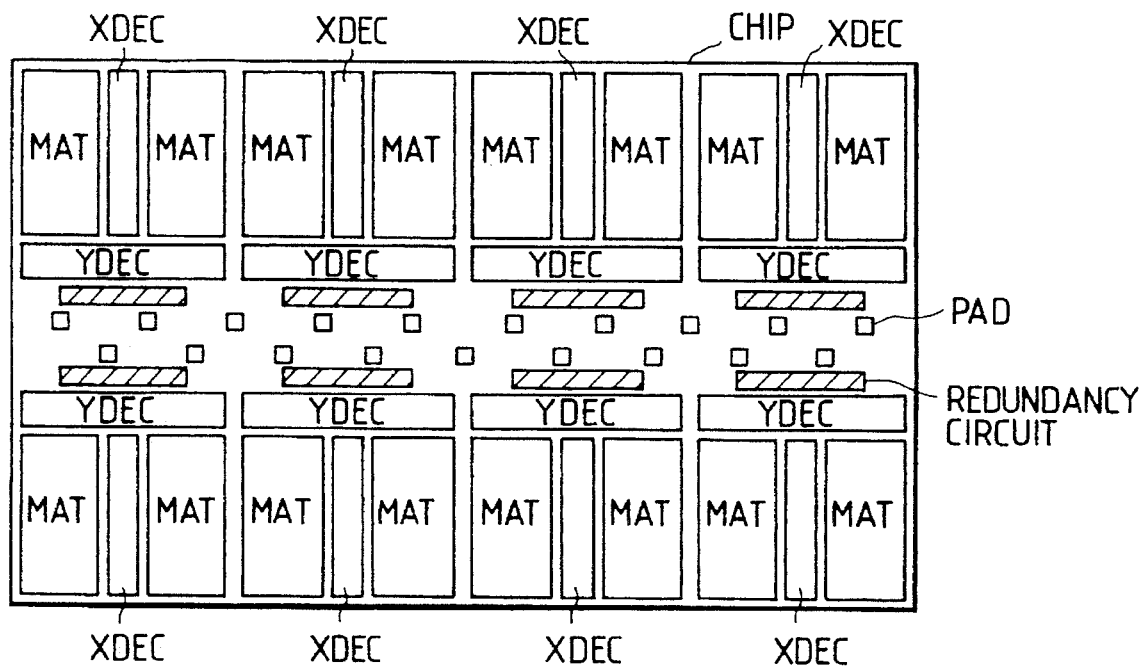
FIG. 29A and FIG. 29B are layout diagrams showing an embodiment of semiconductor integrated circuit device (mask ROM) according to the present invention.
Figure 29B:
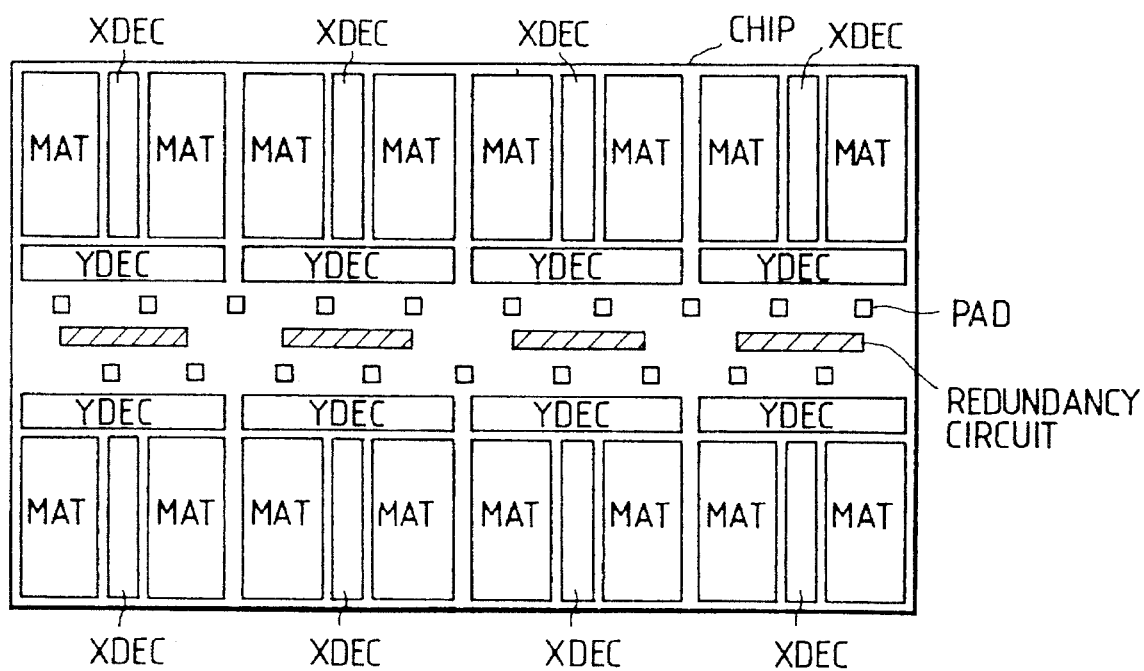

FIG. 29A and FIG. 29B each show a layout diagram of an embodiment of the semiconductor integrated circuit device according to the present invention. The embodiments shown are directed to the arrangement of redundancy circuits using nonvolatile storage elements according to the present invention mounted on a mask ROM.

Referring to FIG. 29A, there are provided pads in the central portion of the chip and there are provided redundancy circuits indicated by hatching between the pads and memory mat MAT.

Referring to FIG. 29B, there are provided two rows of pads in a zigzag arrangement and, between the rows of the pads, there are provided redundancy circuits indicated by hatching.

In the described arrangements,
(1) Since the stress produced in the central portion of the chip when the chip is encapsulated in a package is small, the nonvolatile storage element does not suffer much variation in its characteristics and enhances the reliability.
(2) As the mask ROM becomes larger in capacity, the power supply line, the grounding line, and the signal line become longer. As a result, there occur problems, such as delay in signal passage and malfunction, due to noise. As a countermeasure against such trouble, it is required that pads are disposed in the central portion of the chip. In such case, as the positions for disposing the redundancy circuits, areas surrounding the pads where spaces therefor are easily obtained are preferable. By utilizing such space, increase in the chip size is prevented.

Figure 29C:
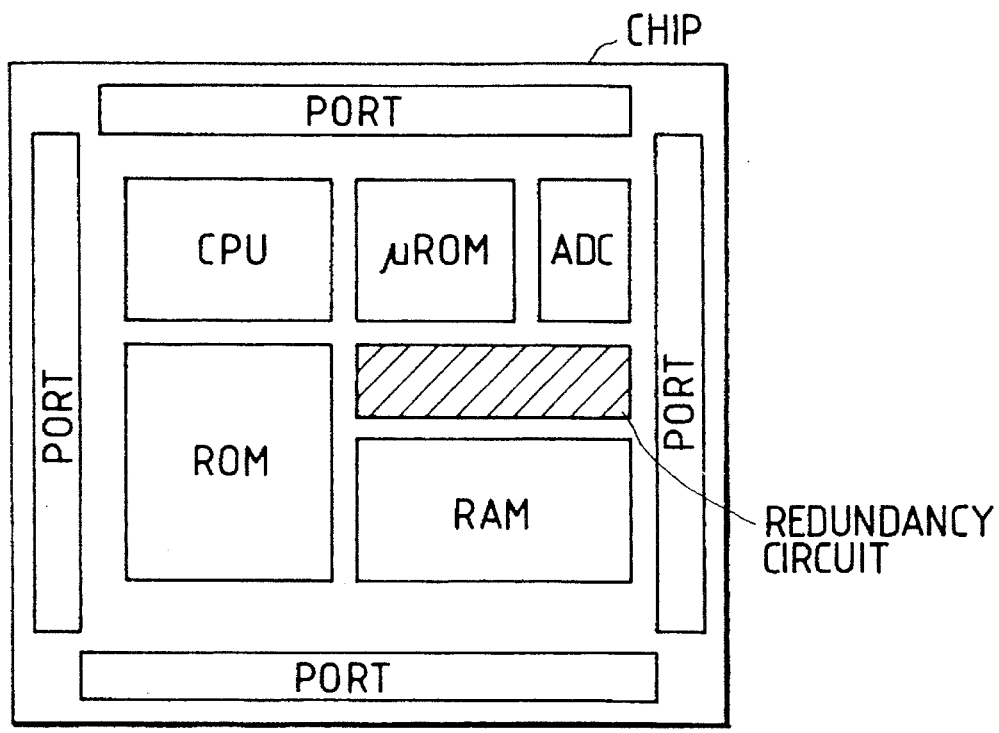
FIG. 29C and FIG. 29D are layout diagrams showing an embodiment of semiconductor integrated circuit device (microcomputer) according to the present invention.
Figure 29D:
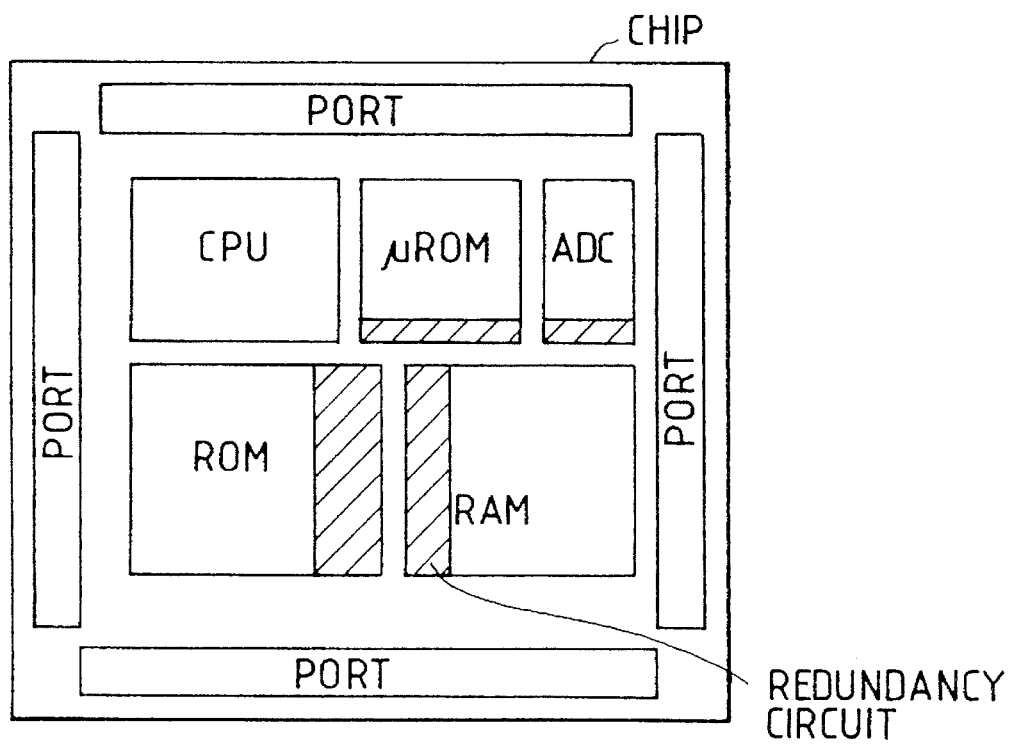

FIG. 29C and FIG. 29D show layout diagrams of another embodiment of the semiconductor integrated circuit device according to the present invention. The embodiment illustrated is directed to the redundancy circuits using nonvolatile storage elements according to the present invention mounted on a microcomputer.

Referring to FIG. 29C, the redundancy circuits given hatching are collected in one region on the chip. In this arrangement, inputting of data lines to the redundancy circuits from the outside is easily achieved.

Referring to FIG. 29D, the redundancy circuits are arranged distributed to each of the functional blocks which are to be redundancy controlled thereby, such as the μ ROM, ROM, RAM, and ADO (analog/digital converter circuit). Since the redundancy circuits are located closely to their corresponding circuits, the delay time in the redundancy control can be shortened.

Figure 30A:
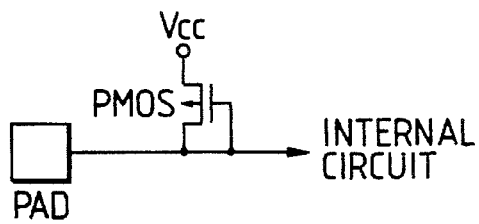
FIG. 30A and FIG. 30B are circuit diagrams showing an embodiment of a pad used for writing into the nonvolatile storage element.
Figure 30B:
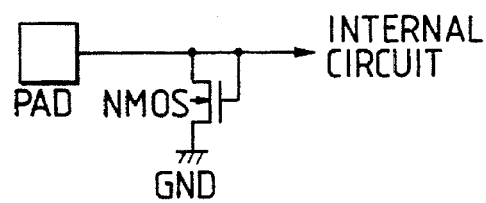

FIG. 30A and FIG. 30B show circuit diagrams of an embodiment of pad for use in an operation for writing into the nonvolatile storage element. In the case of FIG. 30A, there is provided a P-channel MISFET adapted to have a high resistance value for pulling up the pad to the power supply voltage Vcc. In the case of FIG. 30B, there is provided an N-channel MISFET adapted to have a high resistance value for pulling down the pad to the ground potential of the circuit.

As described above, the pad used for the operation for writing into the nonvolatile storage element of single-layer gate structure at the time of redundancy control and changing functions is not directly connected with the external terminal but provided with a pull-up or pull-down resistor element. By virtue of such arrangement, increase in the number of external terminals can be prevented. Further, in the semiconductor integrated circuit device in which the redundancy control or function change has been performed as described above, the pad used therefor is brought to a fixed level by being pulled up or pulled down, and therefore, a malfunction to be caused by a pad having an undesired potential can be prevented. As the resistor element for pulling up or pulling down, that using polysilicon or the like may be used instead of the high resistance MISFET as described above.

Figure 31A:
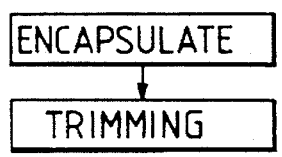
FIG. 31A is a flow chart showing an embodiment of trimming method.

FIG. 31A shows a flow chart for explaining an embodiment of trimming method.

In this embodiment, trimming data is determined after the chip is encapsulated in a package through an external terminal or a terminal used also for another purpose.

Figure 31B:
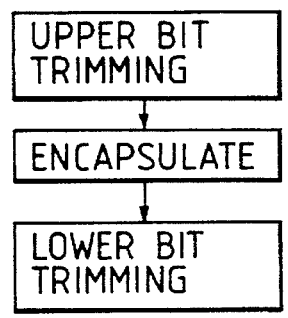
FIG. 31B is a flow chart showing another embodiment of trimming method.

FIG. 31B shows a flow chart for explaining another embodiment of trimming method.

In this embodiment, before a chip is encapsulated in a package, or, in other words, in the proving step upon completion of the chip on a semiconductor wafer, coarse trimming is performed by determining upper bits, and after the chip has been encapsulated in a package, fine trimming is performed by determining the remaining lower bits. Through such trimming method, accurate trimming can be achieved in response to minute variations in the element characteristics to be produced by the heat treatment at the time of encapsulation of the chip in a package and the like.

Figure 32:
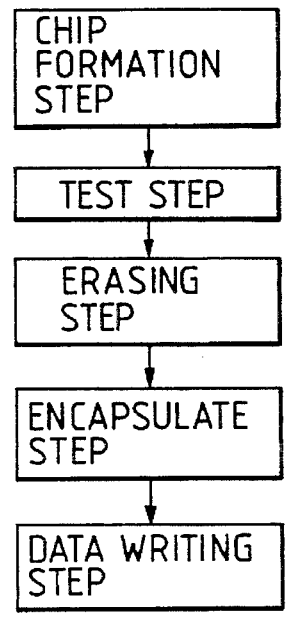
FIG. 32 is a flow chart showing an embodiment of the method whereby writing into the nonvolatile storage element according to the present invention is performed after the element is encapsulated in a package.

FIG. 32 shows a flow chart of an embodiment of method whereby writing into the nonvolatile storage element according to the present invention is performed after a chip has been encapsulated in a package.

In the chip formation step, a desired semiconductor integrated circuit device is formed on a semiconductor wafer as described above.

In the test step, testing of the semiconductor integrated circuit device including the nonvolatile storage element is conducted. The test of the nonvolatile storage element is performed both in the state before writing of data and in the state after writing of data.

In the erasing step, the nonvolatile storage elements are restored to the initial state, that is, to the state before data are written therein. When the nonvolatile storage elements constitute an EPROM, the erasing operation is achieved by exposing the same to ultraviolet rays. The nonvolatile storage element of single-layer gate structure according to the present invention is provided with a barrier layer formed of aluminum or the like over the floating gate. Though this aluminum layer itself does not transmit the ultraviolet ray but erasing is achieved by diffraction or irregular reflection of the ultraviolet ray. Especially when the barrier layer is provided only over a portion of the floating gate or there is made a slit in the barrier layer as described before, effective erasing can be achieved. Even when the whole surface of the floating gate is covered by the aluminum to prevent radical hydrogen out of the final passivation film from reaching the floating gate, satisfactory erasing can be achieved by diffraction and irregular reflection of the ultraviolet rays because the distance of the barrier layer stretching out of the floating gate is small.

In the conventional EPROM of the two-layer gate structure having EPROM of similar two-layer gate structure used for address conversion in redundancy control of defects, it is practiced to cover the whole surface of the address conversion portion by an aluminum layer to prevent the address conversion portion from being also erased when the memory array portion is erased. In such case, having the diffraction and irregular reflection of ultraviolet rays for erasing the memory array portion taken into consideration, the shielding film of aluminum is formed in a large size. Though an aluminum layer is equally used there, this aluminum layer is essentially different in technical concept from the aluminum layer in the nonvolatile storage element of single-layer gate structure according to the present invention used as the barrier layer preventing radical hydrogen out of the final passivation film from getting into the floating gate.

In the encapsulate step, out of chips separated from the semiconductor wafer, those determined to be good as the result of the test are encapsulated in a package.

In the data writing step, desired data is stored in the nonvolatile storage element.

Whatever data may be written into the nonvolatile storage element in the data writing step, a good semiconductor integrated circuit device can be obtained because the test of the nonvolatile storage element has already been finished in the test step.

While the above described test step is effectively applied to any type of nonvolatile storage element, it is especially effective in the case where the nonvolatile storage elements constitute an EPROM and encapsulated in a package of plastic or the like which does not transmit ultraviolet rays as shown in FIG. 33A and FIG. 33B, i.e., in the case where the nonvolatile storage elements are made unerasable by ultraviolet rays but able to be written only once.

The nonvolatile storage elements according to the present invention can be used, other than for redundancy control of defects for the mask ROM, for alteration or correction of data in the mask ROM. Further, the nonvolatile storage element may be applied to PLD using the same as the logical determination element so that setup and change of circuit functions can be achieved. When the nonvolatile storage element of single-layer gate structure is used for setup and change of functions of mask ROM and digital integrated circuits, what is required is only to add the diffusion layer forming the control gate. Such addition of a diffusion layer becomes unnecessary in the case of CMOS circuits because the well region can be utilized. Thus the fabrication process can be made simpler than in the case nonvolatile storage elements of two-layer gate structure are used. Further, since there is provided a barrier layer in the above described nonvolatile storage element of single-layer gate structure reliability is enhanced. The nonvolatile storage elements of single-layer gate structure according to the present embodiment may themselves be used as the main constituent of a semiconductor integrated circuit device. However, its cell size becomes substantially larger than that of the nonvolatile storage element of two-layer gate structure. According ly, the nonvolatile storage element of the present embodiment is suitable for use in a storage circuit of a smaller capacity for such purposes as above described redundancy control of defects in a memory circuit such as a mask ROM or setup/change of functions in a digital circuit.

Functional effects obtained from the above described embodiments are as follows:

(1) By the arrangement made up of a control gate formed of a diffusion layer, a floating gate formed of a conductive layer provided so as to partly overlap with the control gate with a thin insulating layer interposed therebetween, and a barrier layer provided so as to cover the whole surface of the floating gate, an effect is obtained that data retaining characteristic is greatly improved.

(2) When the final passivation film in a semiconductor integrated circuit device is formed of a nitride film produced by a plasma CVD method, a low-priced plastic package can be utilized, and therefore, an effect is obtained that a semiconductor integrated circuit device attaining improvement in the data retaining characteristic by means of the above described barrier layer can be obtained at a low cost.

(3) By using a conductive layer or an oxide film produced by a plasma-CVD method for the above described barrier layer, an effect is obtained that the data retaining characteristic of a nonvolatile storage element of single-layer gate structure can be improved without the need for adding a special fabrication step.

(4) By constructing the barrier layer integrally with the word line, formed of an aluminum layer connected with the above described control gate, an effect is obtained that the barrier layer can be provided in a simple manner.

(5) By using the nonvolatile storage element of single-layer gate structure provided with the above described barrier layer for redundancy control of defects or setup and change of functions of the mask ROM and digital circuits, an effect can be obtained that the redundancy control of defects and setup/change of functions can be achieved without increasing the number of fabrication steps and with enhanced reliability.

(6) In a semiconductor integrated circuit device including an analog circuit, and ROM or RAM, an effect is obtained that the ROM or RAM can be redundancy-controlled before encapsulation of the chip in a package, and trimming of the analog circuit cab be performed after the encapsulation has been finished.

(7) By using the nonvolatile storage element of single-layer gate structure provided with a barrier layer for redundancy control of defects and correction or alteration of data of a mask ROM, such redundancy control of defects and data correction or alteration can be achieved without increasing the number of fabrication steps or the occupied area by the chip and with enhanced reliability.

(8) By connecting sources of a plurality of nonvolatile storage elements of single-layer gate structure corresponding to a word line to a common source line and providing the ground potential of the circuit to them by a switching element switch controlled by a selection signal of the corresponding word line, an effect is obtained that occurrence of a leak current in the storage elements connected with an unselected word line can be prevented and accordingly the withstand voltage can be improved.

(9) In the nonvolatile storage elements arranged in a matrix array, a plurality of memory cells connected to a word line are simultaneously written according to write data stored in a latch circuit provided in the data line, whereby an effect is obtained that the writing period of time can be shortened.

(10) By providing the above described selection signal of a word line by means of a drive circuit generating its output level according to the ratio of conductance between a load MISFET and a drive MISFET, an effect is obtained that circuit simplification can be achieved, and by supplying the switching element providing the ground potential to the sources of the nonvolatile storage elements connected in common with the selection signal treated in a CMOS circuit, through a sub-word line, an effect is obtained that occurrence of the leak current can be positively prevented.

(11) The nonvolatile storage element is arranged, as is the case with the EPROM, such that the voltage Vcc for its ordinary operation is set to a relatively low voltage of 5 V and that for its writing operation is set to a voltage as high as 7 V or 8 V. By this arrangement, an effect is obtained that the need for using a high withstand voltage MISFET can be eliminated for the circuit of the writing system and the fabrication process of the semiconductor integrated circuit device can be simplified.

While the invention has been concretely described as it is related to the preferred embodiments in the foregoing, it is apparent that the invention herein is not limited to the above described embodiments but various modifications can be made without departing from the spirit of the invention.. For example, the barrier layer is only required to be provided in the layer under the final passivation film and in the layer over the floating gate layer. The pattern of the nonvolatile storage element of single-layer gate structure can take various forms.

The nonvolatile storage element of single-layer gate structure according to the present invention is adapted such that writing is performed by hot carriers and erasing is performed by a tunnel current produced by applying high voltage to the source or drain. The same can also be realized as an electrically writable and erasable nonvolatile storage element capable of being written and erased by the tunnel current.

The present invention can be widely applied to semiconductor integrated circuit devices mainly structured of nonvolatile storage elements of single-layer gate structure themselves as well as to semiconductor integrated circuit devices using the nonvolatile storage elements for setup and change of functions thereof, redundancy circuits therefor, and others.

The effects obtained by the representative aspects of the invention disclosed herein will be summarized below. By virtue of the arrangement in which a barrier layer is provided to cover the whole or the part of the surface of a floating gate formed of a conductive layer and provided so as to partly be in an overlapping arrangement with a control gate formed of a diffusion layer, with a thin insulating layer interposed therebetween, it is made possible to greatly improve the data retaining characteristic, By the use of the nonvolatile storage elements of single-layer gate structure provided with the above described barrier layer for redundancy control of defects or setup/change of functions of mask ROMs or digital circuits, the redundancy control of defects and setup/change of functions can be achieved without increasing the number of the fabrication steps and with enhanced reliability.

What is claimed is:

1. A semiconductor integrated circuit device comprising:

a semiconductor substrate having a main surface;

a nonvolatile storage element formed on said main surface, said nonvolatile storage element comprising a semiconductor region formed in said semiconductor substrate, an insulating film formed on said semiconductor region, and a conductive layer extending on said insulating film, said semiconductor region serving as a control gate electrode of said nonvolatile storage element, and said conductive layer serving as a floating gate electrode of said nonvolatile storage element;

a first interlayer insulating film formed over said conductive layer and said nonvolatile storage element so as to cover said main surface and said nonvolatile storage element, said first interlayer insulating film having a first opening;

a word line formed over said first interlayer insulating film, said word line being electrically connected to said semiconductor region through said first opening;

a barrier layer formed over said first interlayer insulating film and said conductive layer, said barrier layer being integrally formed with said word line, being of a size exceeding the size of said conductive layer and being extended over the whole of said conductive layer and said semiconductor region; and a silicon nitride film produced by a plasma CVD method, said silicon nitride film being formed over said barrier layer and said nonvolatile storage element, wherein said barrier layer includes means for preventing radical hydrogen from diffusing from said silicon nitride film into said conductive layer, wherein said conductive layer is comprised of a polycrystalline silicon film, wherein said word line is comprised of an aluminum layer, wherein said silicon nitride film serves as a final passivation film of said semiconductor integrated circuit device, and wherein said nonvolatile storage element is encapsulated in a plastic package which does not transmit ultraviolet rays.

2. A semiconductor integrated circuit device comprising:

a semiconductor substrate having a main surface;

a nonvolatile storage element formed on said main surface, said nonvolatile storage element comprising a semiconductor region formed in said semiconductor substrate, an insulating film formed on said semiconductor region, and a conductive layer extending on said insulating film, said semiconductor region serving as a control gate electrode of said nonvolatile storage element, and said conductive layer serving as a floating gate electrode of said nonvolatile storage element, wherein said conductive layer is comprised of a silicon film;

a first interlayer insulating film formed over said nonvolatile storage element so as to cover said main surface and said nonvolatile storage element, said first interlayer insulating film having a first opening;

a word line formed on said first interlayer insulating film, said word line electrically connected to said semiconductor region through said first opening;

means for preventing radical hydrogen from diffusing into said conductive layer, said means being integrally formed with said word line, said means being formed on both said first interlayer insulating film and said conductive layer, and said means being disposed to cover the whole said conductive layer and being of a size exceeding the size of said conductive layer; and a silicon nitride film produced by a plasma CVD method, said silicon nitride film being formed over said word line and said means so as to cover said main surface and said nonvolatile storage element and serving as a final passivation film of said semiconductor integrated circuit device, wherein said radical hydrogen is diffused from said silicon nitride film, and wherein said nonvolatile storage element and said silicon nitride film are encapsulated in a plastic package which does not transmit ultraviolet rays.

3. A semiconductor integrated circuit device according to claim 2, wherein said conductive layer is comprised of a polycrystalline silicon film, and wherein said word line is comprised of an aluminum layer.

4. A semiconductor integrated circuit device according to claim 3, wherein said nonvolatile storage element is a memory cell of an erasable programmable read-only memory (EPROM).

5. A semiconductor integrated circuit device according to claim 2, wherein said nonvolatile storage element is a memory cell of an erasable programmable read-only memory (EPROM).

6. A semiconductor integrated circuit device according to claim 2, wherein said conductive layer is comprised of a polycide film including a silicide layer on a polycrystalline silicon film, and wherein said word line is comprised of an aluminum layer.

7. A semiconductor integrated circuit device according to claim 6, wherein said nonvolatile storage element is a memory cell of an erasable programmable read-only memory (EPROM).

* * * * *